(12) United States Patent
Kiyota et al.

(10) Patent No.: US 8,149,593 B2
(45) Date of Patent: Apr. 3, 2012

(54) RADIATION LEVEL REDUCING DEVICE

(75) Inventors: Yukinori Kiyota, Chiba (JP); Kensei Sugita, Chiba (JP)

(73) Assignee: Sony Corporation, Tokyo (JP)

( * ) Notice: Subject to any disclaimer, the term of this patent is extended or adjusted under 35 U.S.C. 154(b) by 252 days.

(21) Appl. No.: 12/691,245

(22) Filed: Jan. 21, 2010

(65) Prior Publication Data

US 2010/0195305 A1 Aug. 5, 2010

(30) Foreign Application Priority Data

Feb. 3, 2009 (JP) ................................. 2009-022800

(51) Int. Cl.
*H05K 9/00* (2006.01)

(52) U.S. Cl. ........ 361/818; 361/816; 361/800; 174/350; 174/385

(58) Field of Classification Search .................. 361/753, 361/799, 800, 818, 816; 174/350, 377, 385, 174/392, 396
See application file for complete search history.

(56) References Cited

U.S. PATENT DOCUMENTS

| 4,891,468 A * | 1/1990 | Andrae | 174/392 |
| 6,546,107 B1 * | 4/2003 | Bohnke | 381/189 |
| 7,095,627 B2 * | 8/2006 | Yokota | 361/816 |
| 7,787,259 B2 * | 8/2010 | Free et al. | 361/816 |
| 7,916,501 B2 * | 3/2011 | Free et al. | 361/816 |
| 2003/0076656 A1 * | 4/2003 | Roy et al. | 361/690 |
| 2007/0257337 A1 * | 11/2007 | Yanase et al. | 257/659 |

FOREIGN PATENT DOCUMENTS

| JP | 7-212079 | 8/1995 |
| JP | 9-312489 | 12/1997 |
| JP | 11-354966 | 12/1999 |
| JP | 2007-95971 | 4/2007 |

OTHER PUBLICATIONS

U.S. Appl. No. 13/143,154, filed Jul. 1, 2011, Kiyota, et al.

* cited by examiner

*Primary Examiner* — Dameon Levi
(74) *Attorney, Agent, or Firm* — Oblon, Spivak, McClelland, Maier & Neustadt, L.L.P.

(57) ABSTRACT

A radiation level reducing device, including: a metal plate for covering surface of an electromagnetic wave generation source for radiating an electromagnetic wave; a cover region, set within a plane of the metal plate, for covering the surface; and a plurality of slits formed to a band-shape in the cover region, and spaced apart from each other, wherein each of the plurality of slits includes, a drawing slit extending towards a central part of the cover region from an intense electric field position where an electric field generated in between the electromagnetic wave generation source by the electromagnetic wave is stronger than other positions at an outer periphery of the cover region, and a coupling slit extending so as to line in parallel to another slit from an end in the central part direction of the cover region in the drawing slit.

8 Claims, 19 Drawing Sheets

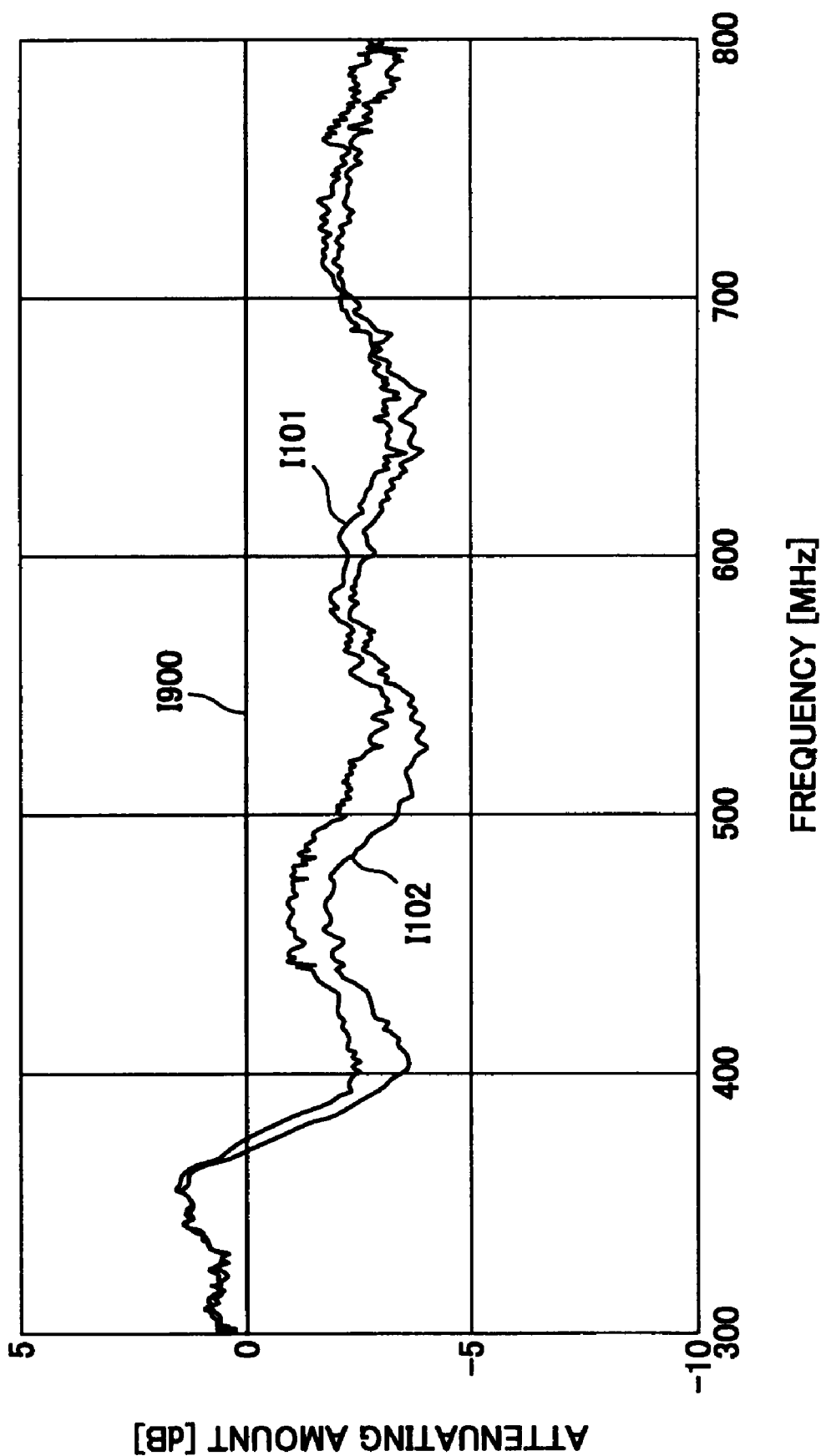

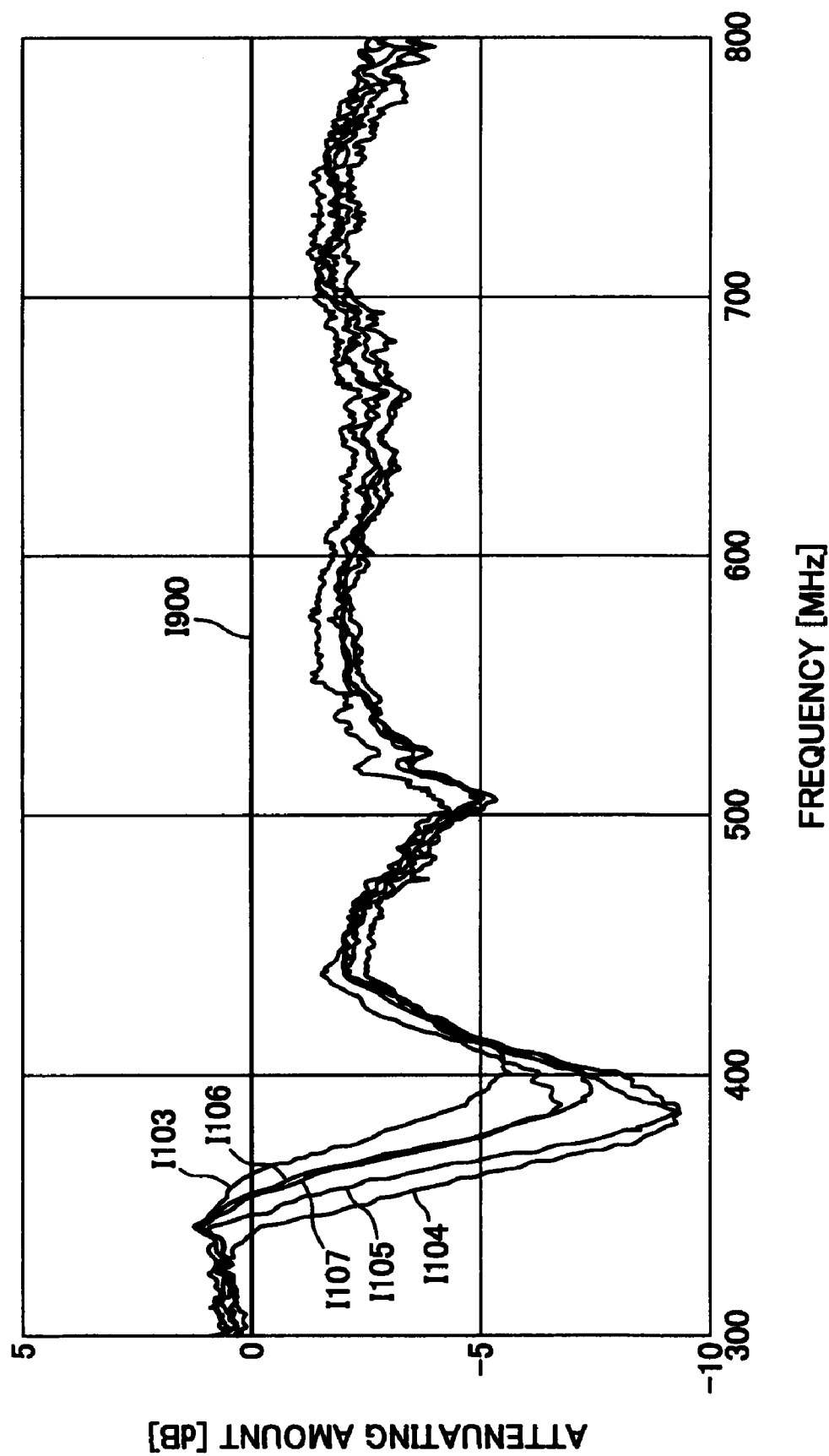

RADIATION LEVEL REDUCING DEVICE

BACKGROUND OF THE INVENTION

1. Field of the Invention

The present invention relates to a radiation level reducing device.

2. Description of the Related Art

In recent years, higher density and higher integration of a CPU, an LSI, a clock IC, a peripheral semiconductor and the like, which are used inside a device, and higher density of a print wiring are advancing with advancement in electronic devices including a television, a computer, a camera, and a portable telephone. The component of the frequency handled in such electronic components and the like is also becoming higher frequency.

Accompanied therewith, problems such as influence on human body, false operation, functional failure, characteristics degradation and the like due to radiation noise (electromagnetic wave) generated from an electronic component and conduction noise (electromagnetic wave) generated from a line pattern formed on a print substrate arise. EMC (Electro-Magnetic Compatibility), EMI (Electro-Magnetic Interference), EMS (Electro-Magnetic Susceptibility) measures are thus further being desired.

SUMMARY OF THE INVENTION

Generally, a mechanism for suppressing unnecessary electric wave and unnecessary noise radiated from an electronic device with a shield case is the main stream of a means for reducing unnecessary electric wave in the electronic device.

This is a method of using a metal plate having conductivity as a shield plate and sealing the radiation noise generated from a substrate by reflecting (see Japanese Patent Application Laid-Open No. 7-212079). Although this method is effective in the leakage of radiation noise, the electromagnetic wave interference of the scattered radiation noises may be promoted since the radiation noise from various types of components such as IC and patterns are reflected by the shield case.

Furthermore, the shield case structure becomes complicating to reduce the radiation of the electromagnetic wave such as radiation noise, which consequently leads to increase in manufacturing cost (see Japanese Patent Application Laid-Open No. 11-3549669).

When such shield case and the like are used, screw-fitting, plate spring, gasket, and the like are used to join a cover and the shield case, which configure a housing.

When joining by screw-fitting, a troublesome screw-fitting task is required, and the installing locations of the screw between the cover and the shield case need to be increased to enhance the shield effect. The screw-fitting task thus increases, and the assembly task efficiency significantly lowers.

When the plate spring is used, the task of forming the plate spring itself takes considerable time, which greatly increases the attachment man-hour, and increases the cost.

In a case of a gasket added with conductive metal powder or an article including an insulative soft magnetic body, the gasket and the sheet themselves are expensive, and the usage location is greatly limited due to restriction in the attachment structure.

Japanese Patent Application Laid-Open No. 9-312489 discloses a complex magnetic body that performs measures with the radiation noise from a cable and the like as a target of the EMI measures. In this method, however, the conduction noise generated from the line pattern formed on the print substrate is difficult to suppress. The conductive noise that is not suppressed thus generates by power supply voltage fluctuation and the like caused by switching operation, thereby affecting the electronic device, the circuit, and the like.

Japanese Patent Application Laid-Open No. 2007-95971 discloses an electromagnetic wave shielding sheet for covering a radiation unit, which radiates the electromagnetic wave. However, this sheet not only increases the manufacturing steps due to its complicating configuration but is also expensive, and thus may increase the manufacturing cost of the product.

Therefore, the radiation preventing method has advantages and disadvantages, and development of an easy and inexpensive method capable of appropriately suppressing the radiation noise and the conduction noise is desired. However, since the electronic circuit, in which reduction of noise is increasingly desired due to higher frequency and the like, is complicating, noises of various positions and frequencies are generated. Such noises are not uniformed, where measures by the shield case structure and the like are known to be complicating and noise reduction by the shield case is also limited. Therefore, an easy and inexpensive radiation preventing means capable of effectively reducing radiation is desired.

In light of the foregoing, it is desirable to provide a novel and improved radiation level reducing device capable of more effectively suppressing noise (electromagnetic wave) radiated from an electromagnetic wave generation source such as an electronic circuit easily and inexpensively.

According to an embodiment of the present invention, there is provided a radiation level reducing device, including: a metal plate for entirely covering at least one surface of an electromagnetic wave generation source for radiating an electromagnetic wave; a cover region, set within a plane of the metal plate, for covering the entire one surface; and a plurality of slits formed to a band-shape in at least the cover region, and spaced apart from each other, wherein each of the plurality of slits includes, a drawing slit formed extending towards a central part of the cover region from an intense electric field position where an electric field generated in between the electromagnetic wave generation source by the electromagnetic wave is stronger than other positions at an outer periphery of the cover region so as to guide a circular current flowing in a peripheral direction surrounding the central part of the cover region in the central part direction of the cover region by the electromagnetic wave, and a coupling slit formed extending so as to line in parallel to another slit from an end in the central part direction of the cover region in the drawing slit so as to guide the circular current guided by the drawing slit to in between the other slit adjacent on one side in the peripheral direction of the cover region.

$2^N$ slits may be formed on the metal plate, N being a positive integer.

The plurality of slits may be arranged point symmetrically from each other with the central part of the cover region as a reference.

The cover region may be an entire region of the metal plate, the metal plate may be formed with a center distance from the central part to the outer periphery unequal, and the intense electric field position may be an edge position where the center distance is long compared to other sites.

The metal plate may be formed to a polygon having $2^M$ corners at an outer periphery, M being a positive integer of greater than or equal to two, and the intense electric field position may be the corner.

The metal plate may be a regular polygon.

The intense electric field position may be a position at the outer periphery of the cover region corresponding to a corner in one surface of the electromagnetic wave generation source.

The cover region may be an entire region of the metal plate, and the metal plate may be formed to a circular shape in which a center distance from the central part to the outer periphery equal.

According to the embodiments of the present invention described above, the noise (electromagnetic wave) radiated from an electromagnetic wave generation source such as an electronic circuit can be more effectively suppressed easily and inexpensively.

BRIEF DESCRIPTION OF THE DRAWINGS

FIG. 5B is an explanatory view describing an example of the radiation level reducing device according to the embodiment;

FIG. 6B is an explanatory view describing an example of the radiation level reducing device according to the embodiment;

DETAILED DESCRIPTION OF THE EMBODIMENTS

Figure 1A:
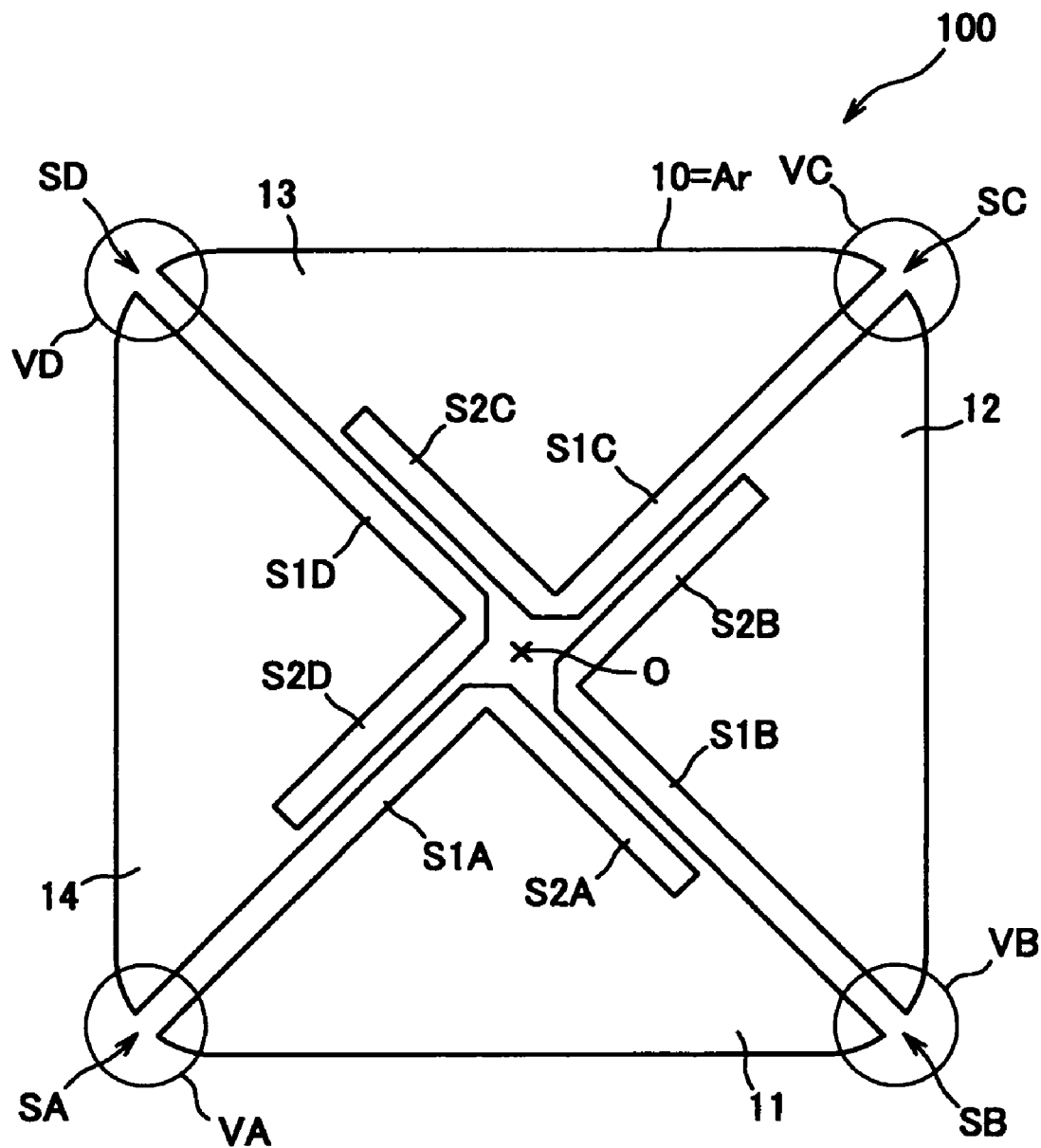
FIG. 1A is an explanatory view describing a configuration of a radiation level reducing device according to a first embodiment of the present invention.
Figure 1A:
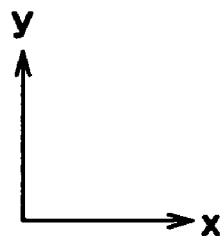

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

The radiation level reducing device according to each embodiment of the present invention can be used for various electromagnetic wave generating sources. A wide variety of electromagnetic wave generating sources from various electronic elements including CPU (Central Processing Unit), LSI (Large Scale Integration), clock IC (Integrated Circuit), peripheral semiconductor, print substrate, wiring, coil, resistor, and capacitor, to an electronic device formed by combining the above may be used. The application of the radiation level reducing device is not limited to the example of the electromagnetic wave generation source, and may be applied to various regions that emit electromagnetic wave. In this case, the radiation level reducing device is arranged in close contact with the electromagnetic wave generation source on the direction side not desiring to propagate the electromagnetic wave radiated by the electromagnetic wave generation source, or is arranged in the vicinity thereof. The radiation level reducing device may be arranged distant from the electromagnetic wave generation source, but is desirably arranged on the electromagnetic wave generation source side in view of shielding or attenuation efficiency of the electromagnetic wave, spatial efficiency of the entire device, and the like. The description will be made in the following order to facilitate the understanding on the radiation level reducing device.

1. Radiation level reducing device according to related art
2. Radiation level reducing device according to first embodiment
   2-1. Configuration of radiation level reducing device
   2-2. Operation example of radiation level reducing device
   2-3. Example of radiation level reducing device
   2-4. Implementation example of radiation level reducing device 2-5. Variant of radiation level reducing device 2-6. Example of effects of radiation level reducing device

1. Radiation Level Reducing Device According to Related Art

Figure 10:
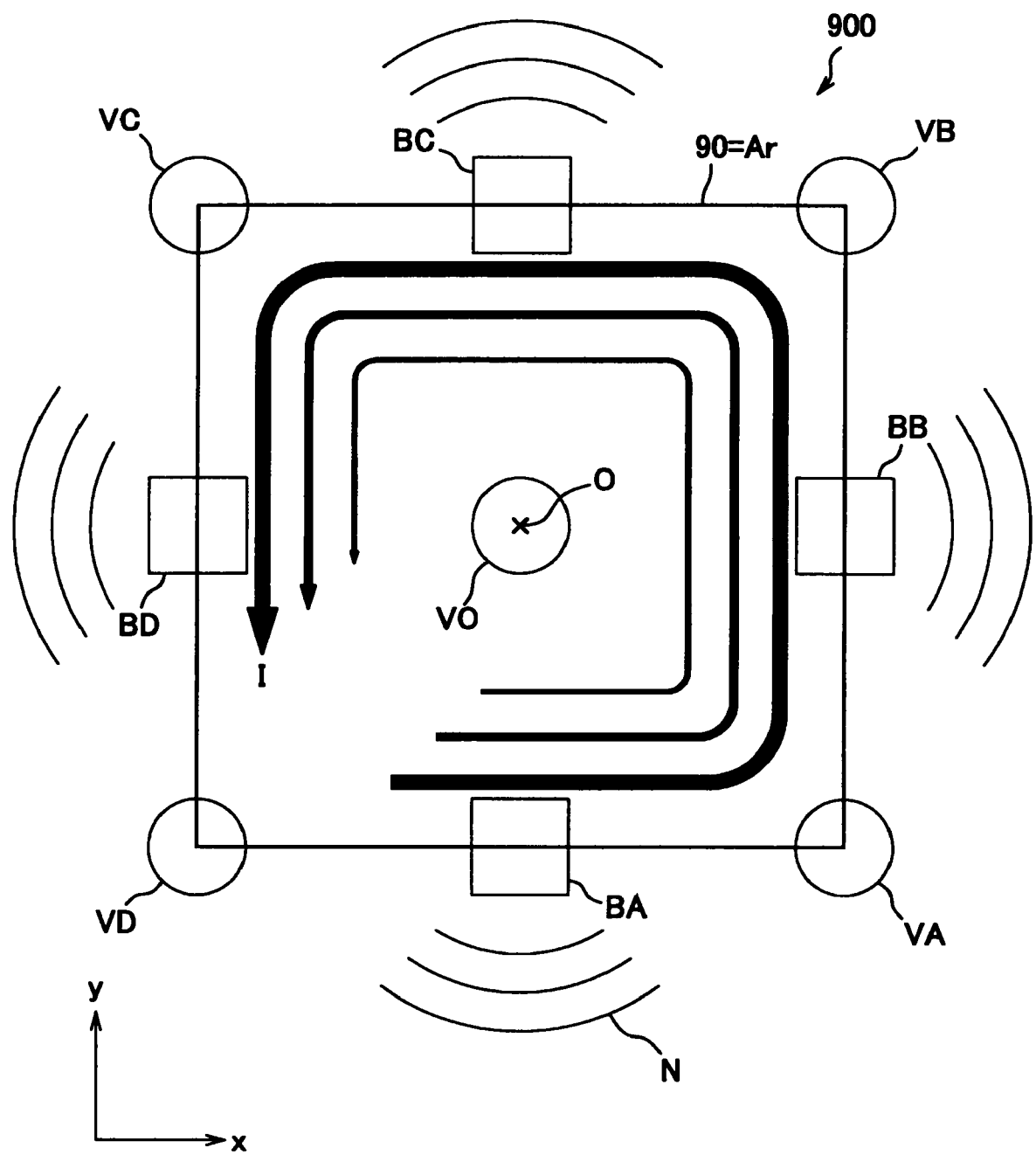
FIG. 10 is an explanatory view describing a radiation level reducing device according to a related art.

First, a radiation level reducing device according to the related art will be described with reference to FIG. 10. FIG. 10 is an explanatory view describing the radiation level reducing device according to the related art.

In FIG. 10, an example of a case in which a metal plate 90 is used as a shielding shield of the electromagnetic wave, that is, a radiation level reducing device 900 according to the related art is shown. The metal plate 90 shown in FIG. 10 has conductivity and is arranged to cover an electromagnetic wave generation source (hereinafter also referred to as "noise generation source R"). Although not illustrated, the noise generation source R of the same extent as or one size smaller than the outer shape (outer shape in x-y plane) at the formed surface of the metal plate 90 is arranged on the back surface (far side in plane of drawing) of the metal plate 90 shown in FIG. 10.

The electromagnetic wave (noise) generated from the noise generation source R is reflected by the radiation level reducing device 900 according to the related art. However, the energy thereof does not attenuate, and is radiated from the outer periphery or the surface of the radiation level reducing device 900 according to the related art or from between the noise generation source R. Such phenomenon is referred to herein as "secondary radiation", and the secondary radiated electromagnetic wave is referred to herein as "noise N".

Various circuits serve as the noise generation source R and generate electromagnetic wave, and the noise N of the secondary radiation is emitted from the radiation level reducing device 900 according to the related art. The strong noise N of the secondary radiation is roughly divided into two types. The noise N of the first type is the main noise, and is a radiation having the metal plate 90 as a patch antenna. This noise N is mainly emitted from the surface of the metal plate 90 towards the opposite side of the noise generation source R. The noise N of the second type is emitted when an opening formed by an edge (end) of the metal plate and a GND (ground) surface in the substrate, where the noise generation source R is arranged, operate as if an electrostatic capacity antenna.

The generation mechanism of the secondary radiation noise N that became apparent as a result a thorough research conducted by the inventors of the present invention will be briefly described below.

If the metal plate 90 covering the noise generation source R is arranged as with the metal plate 90 of the radiation level reducing device 900 according to the related art, the electric field generates as if a standing wave at the lower part of the metal plate 90, that is, between the metal plate 90 and the noise generation source R. The position of strong generated electric field (referred to as "intense electric field position") is shown in FIG. 10. As shown in FIG. 10, the intense electric field positions VA to VD generate at four corners of the metal plate 90, and the intense electric field position VO generates at the middle of the metal plate 90. The intense electric field positions are determined at least by one of either the shape of the metal plate 90 or the shape of the noise generation source R. The loop of the electric field of pseudo-standing wave generates at the intense electric field positions VA to VD, VO, where the sign of the electric field of the adjacent intense electric field positions is inverted with respect to each other. Thus, a circular current I (hereinafter also referred to as outer peripheral current) flows by the electric field.

The circular current I flows the outer periphery so as to surround the central part O of the metal plate 90, and becomes smaller towards the central part O. When such circular current I flows, a magnetic field generates at the upper part and the lower part of the metal plate 90. The magnetic field generated at the lower part of the metal plate 90 generates as if a standing wave similar to the intense electric field position of the electric field mentioned above. The position of strong generated magnetic field (referred to as "ferromagnetic field position") is shown in FIG. 10. As shown in FIG. 10, the ferromagnetic field positions BA to BD generate at the middle of four sides of the metal plate 90. In other words, the ferromagnetic field positions BA to BD generate at the midpoint of the intense electric field positions VA to VD.

The electric field and the magnetic field generated at the lower part of the metal plate 90 respectively perform an operation similar to the electric field and the magnetic field generated by the electrostatic capacity antenna between the GND in the substrate and the metal plate 90. The electric field and the magnetic field generate noise N (noise N of second type; may not be accurate secondary radiation) through the opening between the GND in the substrate and the metal plate 90. The magnetic field generated at the upper part of the metal plate 90 by the circular current I generates the electric field in chain reaction and generates noise N (noise N of first type).

Therefore, in the radiation level reducing device 900 according to the related art simply formed with the metal plate 90, the electromagnetic wave radiated by the noise generation source R is simply scattered in the x-y plane direction (noise N of second type) or is again radiated from the surface of the metal plate 90 (noise N of first type).

The inventors of the present invention who conducted a thorough research on the noise N etc. of the radiation level reducing device 900 according to the related art clarified the generation mechanism of the noise N as described above, and completed the embodiment of the present invention through further researches and developments in an aim of reducing the noise N. Each embodiment of the present invention will be described below. It is to be understood that the generation mechanism of the noise N described herein does not limit the noise N, and that the radiation level reducing device according to each embodiment of the present invention can reduce even the radiation level of noise other than the two types of noise N described above.

2. Radiation Level Reducing Device According to First Embodiment

Figure 1B:
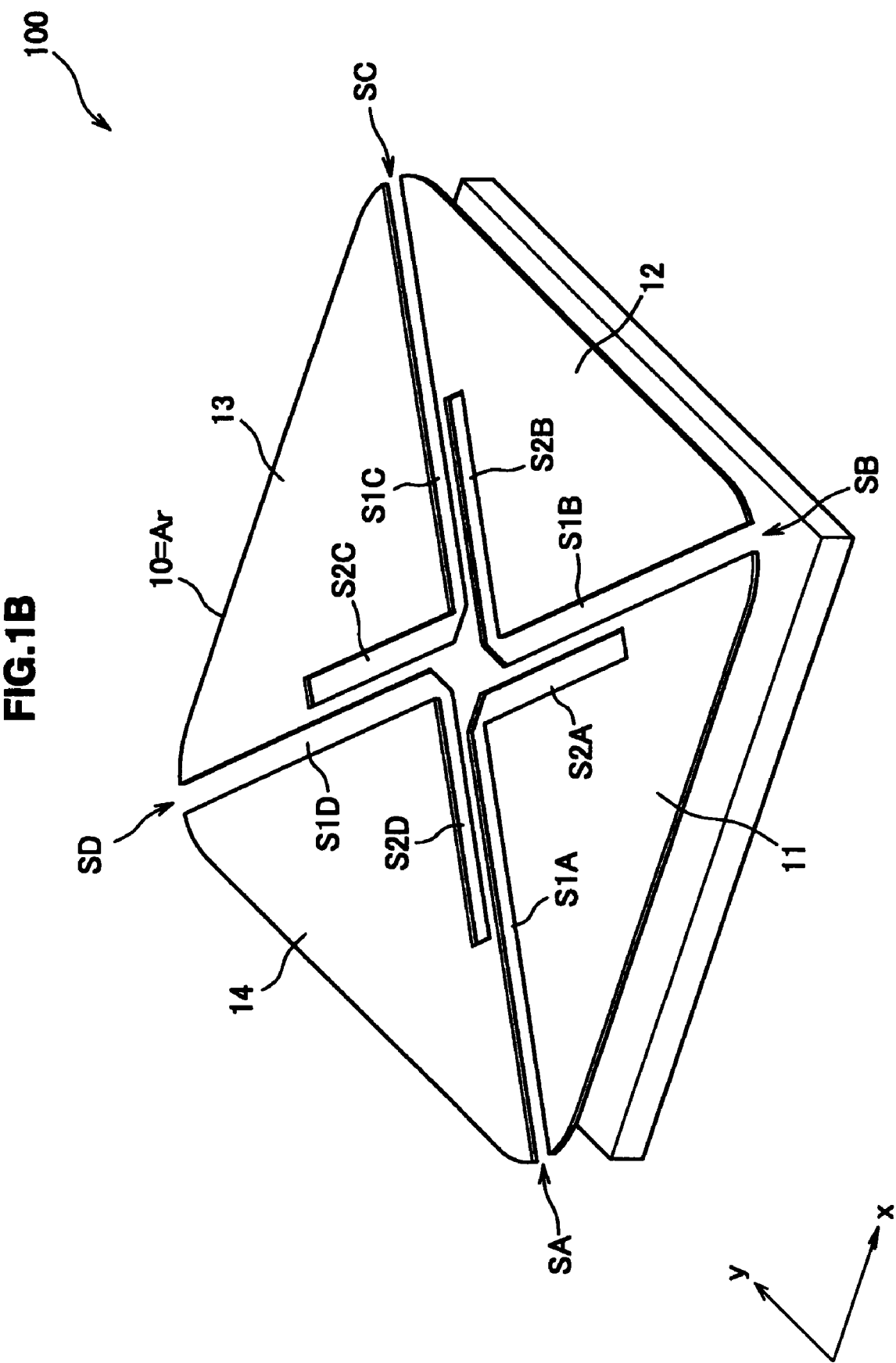
FIG. 1B is an explanatory view describing the configuration of the radiation level reducing device according to the embodiment.

First, a configuration of the radiation level reducing device according to a first embodiment of the present invention will be described with reference to FIGS. 1A and 1B. FIGS. 1A and 1B are explanatory views describing the configuration of the radiation level reducing device according to the first embodiment of the present invention.

2-1. Configuration of Radiation Level Reducing Device

As shown in FIG. 1A, a radiation level reducing device 100 according to the present embodiment roughly includes a metal plate 10 and slits SA to SD.

In the present embodiment, a case in which the radiation level reducing device 100 reduces the radiation level of the electromagnetic wave radiated to the upper side of the noise generation source R will be described, as shown in FIG. 1B, for the sake of convenience of explanation. The metal plate 10 described below is thus formed to a shape that covers the upper surface of the noise generation source R, and the radiation level reducing device 100 is arranged near the upper surface side of the noise generation source R. The shape of the metal plate 10, the arrangement position of the radiation level reducing device 100, and the like can be appropriately changed according to the noise generation source R, the direction of reducing the radiation level, and the like.

The metal plate 10 is made from a material having conductivity, and includes a cover surface that can cover at least the entire upper surface (one example of one surface) of the noise generation source R (one example of electromagnetic wave generation source) for radiating the electromagnetic wave. As shown in FIG. 1B, the metal plate 10 according to the present embodiment is entirely formed as a cover surface. However, the cover surface of the metal plate 10 may not be over the entire region of the metal plate 10, and may be over a region of one part of the metal plate 10. That is, the metal plate 10 can be formed to various shapes as long as it has a surface (cover surface) corresponding to the entire upper surface of the noise generation source R. The region of the metal plate 10 that becomes the cover surface is also referred to as "cover region Ar".

That is, in the present embodiment, the cover region Ar is comparable to the entire region of the metal plate 10. If the cover region Ar is comparable to the entire region of the metal plate 10, the area of the metal plate 10 is desirably between 1 and 1.5 times, and more preferably between 1.25 and 1.5 times the area of the upper surface of the noise generation source R to be covered by the metal plate 10. The metal plate 10, however, may be formed much larger than the upper surface of the noise generation source R.

In the present embodiment, a case in which the metal plate 10 is formed to a square in correspondence to the shape of the upper surface of the noise generation source R is shown. However, the metal plate 10 may not correspond to the shape of the upper surface of the noise generation source R, and may not be a square. The metal plate 10 is desirably formed in the following order to enhance the radiation level reducing effect and the like of the radiation level reducing device 100.

Square≧Regular polygon>Polygon>Ellipse>Circle

Other than the shapes mentioned in the example, the metal plate 10 may have a shape in which the center distance is unequal.

The cover region Ar is a region that is set within a plane of the meal plate 10, and that covers the entire upper surface of the noise generation source R. As described above, the cover region Ar is set to the entire region of the metal plate 10 in the present embodiment.

The slits SA to SD are formed to a band-shape at least in the cover region Ar. The slits SA to SD can be formed by cutting out one part of the metal plate 10 in a band-shape (also referred to as groove) or by forming the metal plate 10 itself excluding the slits SA to SD. As shown in FIG. 1A, the slits SA to SD are formed towards a central part O and is formed to a cross-like shape as a whole, but the slits adjacent in the peripheral direction of the metal plate 10 are not connected to each other and are spaced apart. Therefore, metal plate pieces 11 to 12 pseudo-partitioned by the slits SA to SD are connected to each other by way of the central part O to form the metal plate 10.

In the present embodiment, four of such slits SA to SD are formed, as shown in FIG. 1A. However, the number of slits SA to SD is not limited to four, and merely needs to be in plurals. However, $2^N$ of such slits SA to SD is desirably formed on the metal plate 10, where N is a positive integer.

As shown in FIG. 1A, the slits SA to SD according to the present embodiment are arranged point symmetrically with the central part O of the cover region Ar (i.e., metal plate 10) as a reference. Each slit SA to SD is formed to a similar shape. The shape of each slit will be first described using the slit SA by way of example.

As shown in FIG. 1A, the slit SA is broadly divided into a drawing slit S1A and a coupling slit S2A.

The drawing slit S1A is formed extending from the intense electric field position VA at the outer periphery of the cover region Ar towards the central part O of the cover region Ar. Since the cover region Ar and the entire metal plate 10 match in the present embodiment, the drawing slit S1A is formed from the end of the metal plate 10. The intense electric field position VA at the outer periphery of the cover region Ar is generated at four corners (corner portion, intense electric field position) of the cover region Ar, as shown in FIG. 10, and thus the drawing slit S1A is formed extending in a band-shape from such corner towards the central part O.

Furthermore, the drawing slit S1A is formed in a straight line to a band-shape from the corner towards the central part O in the present embodiment, but the drawing slit S1A may be curved. However, the drawing effect of the circular current I by the drawing slit S1A enhances, and the radiation level reducing effect enhances if the drawing slit S1A is formed in a straight line as in the present embodiment.

The coupling slit S2A is formed extending from the end in the central part O direction of the cover region Ar of the drawing slit S1A so as to be lined in parallel to another slit SB (or slit SD) on one side in the peripheral direction of the cover region Ar. More specifically, the coupling slit S2A is formed extending so as to be lined in parallel to the drawing slit S1B of another slit SB in the present embodiment.

In the present embodiment, a case in which the coupling slit S2A is formed extending to the right side (counterclockwise direction) of the drawing slit S1A in the peripheral direction of the cover region Ar is shown. Therefore, each coupling slit S2B to S2D is formed extending to the right side (counterclockwise direction) at the end of the central part O direction in other drawing slits S1B to S1D as well. The coupling slits S2A to S2D, however, may be formed extending to the left side (clockwise direction) of each drawing slit in the peripheral direction of the cover region Ar.

The coupling slit S2A according to the present embodiment is formed parallel to the drawing slit S1B of the adjacent slit SB, and is formed with a predetermined spacing with such drawing slit S1B. The coupling slit S2A is desirably formed shorter than the lined drawing slit S1B so as not to be formed up to the end of the cover region Ar. The coupling slit S2A is desirably formed to a band-shape with a width same as or approximate to the drawing slit S1A.

The coupling slit S2A guides the circular current I, which is guided by the drawing slit S1A, substantially parallel to the lined drawing slit S1B to realize the coupling effect of coupling the same with the circular current I guided by the drawing slit S1B.

The drawing slit S1A and the coupling slit S2A described here respectively correspond to the slit SA, but other slits SB to SD similarly include one of each of the drawing slit S1B to S1D and the coupling slit S2B to S2D. In other words, each slit SA to SD is formed to a substantially L-shape, which L-shaped slits SA to SD are formed extending from four corners of the metal plate 10. As a result, the slits SA to SD partition the metal plate 10 to four metal plate pieces 11 to 14 of a substantially cross-shape. The slits SA to SD of substantially L-shape are spaced apart from each other, and the metal plate pieces 11 to 14 forming the metal plate 10 are coupled to each other at the central part O.

(Regarding Intense Electric Field Position)

As described above, the slits SA to SD are respectively formed from the intense electric field positions VA to VD towards the central part O direction. The intense electric field positions VA to VD will be described.

The intense electric field positions VA to VD are locations where an electric field generates with the noise generation source R due to the electromagnetic wave generated by the noise generation source R, where such electric field is large compared to other sites. Such intense electric field positions VA to VD correspond to locations where a spatial impedance between the metal plate 10 and the noise generation source R is low. In the radiation level reducing device 100 according to the present embodiment, the metal plate 10 is formed to a polygon (square) of the same extent as the noise generation source R or an extent of covering the same, but in this case, the spatial impedance of the corners of the metal plate 10 becomes low compared to other sites. Therefore, in the radiation level reducing device 100 according to the present embodiment, the four corners of the metal plate 10 are the intense electric field positions VA to VD, and the slits SA to SD are formed from such four corners. Since the intense electric field positions VA to VD differ depending on the shape of the metal plate 10, the shape of the noise generation source R, and the like, as mentioned above, the positions where the slits SA to SD are formed may be changed depending on the shape of the metal plate 10, the shape of the noise generation source R, and the like. The intense electric field positions become the edge positions (ends), which center distance is long compared to other sites, when the metal plate 10 is formed such that the center distance from the central part O to the outer periphery is unequal. More specifically, the intense electric field position is a corner (corner portion) if the metal plate 10 is a polygon, and is four corners shown in FIG. 1A if the metal plate 10 is a square as in the present embodiment. If the metal plate 10 does not have a corner and the metal plate 10 is significantly larger than the cover region Ar, the intense electric field positions VA to VD are positions at the outer periphery of the cover region Ar corresponding to the corners of the upper surface of the noise generation source R. Therefore, in such a case, the slits SA to SB are formed from the intense electric field positions corresponding to the corners of the upper surface of the noise generation source R.

The configuration of the radiation level reducing device 100 according to the first embodiment of the present invention has been described above.

The operation example of the radiation level reducing device according to the first embodiment of the present invention will now be descried with reference to FIGS. 2A to 3B. FIGS. 2A to 3B are explanatory views describing the operation example of the radiation level reducing device according to the present embodiment.

2-2. Operation Example of Radiation Level Reducing Device 2-2-1. Circular Current Attenuating Operation First, the attenuating operation of the circular current I, which is the main generation source of noise N, will be described.

As described in FIG. 10, when the electric field and the magnetic field similar to the standing wave generates between the metal plate 10 and the noise generation source R by the electromagnetic wave generated by the noise generation source R, the circular current I circularly flows so as to surround the central part O of the cover region Ar by such electric field and magnetic field. The circular current I is the main cause of generation of the noise N of the secondary radiation and the like.

Figure 2A:
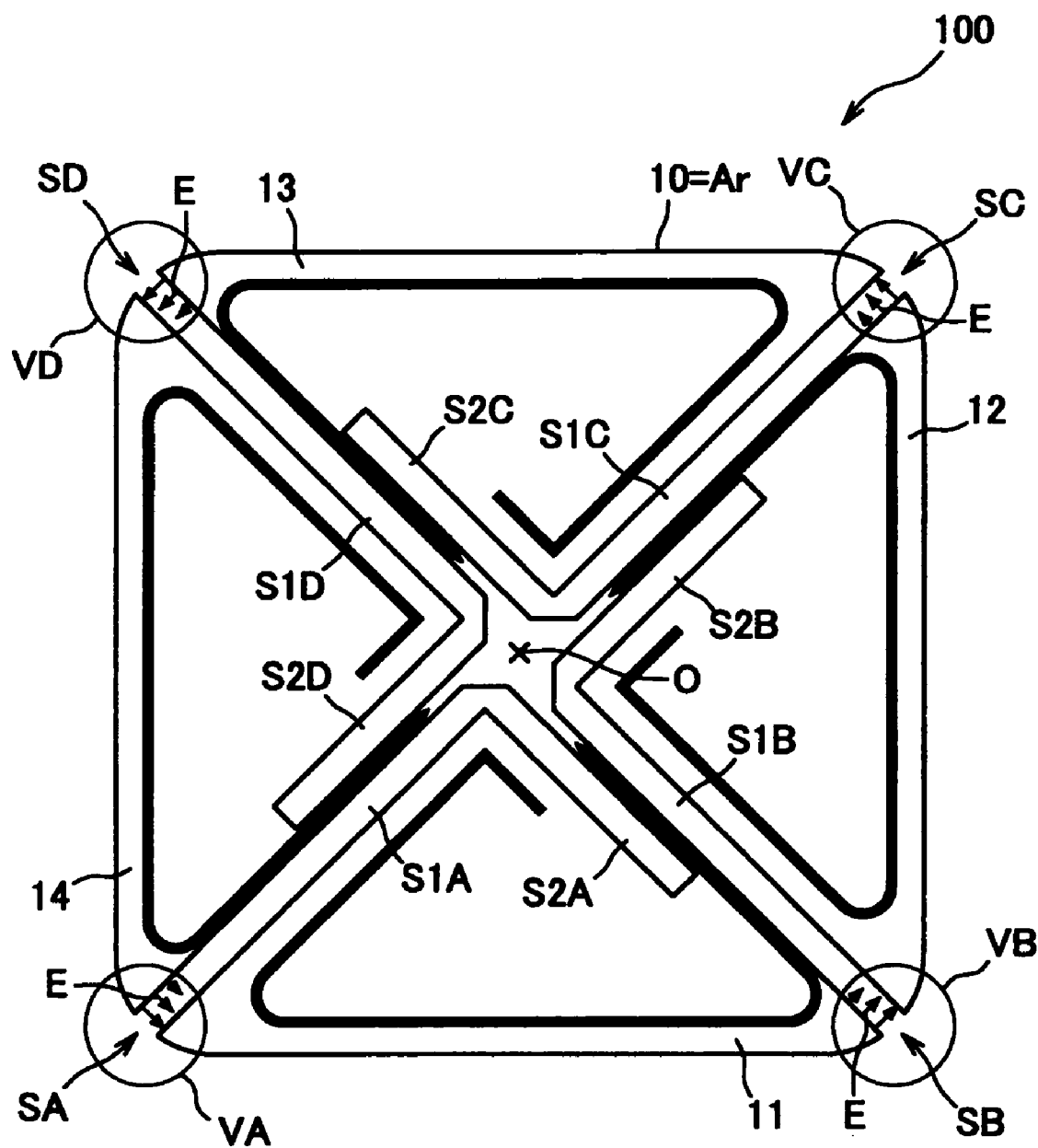
FIG. 2A is an explanatory view describing an operation example of the radiation level reducing device according to the embodiment.
Figure 2B:
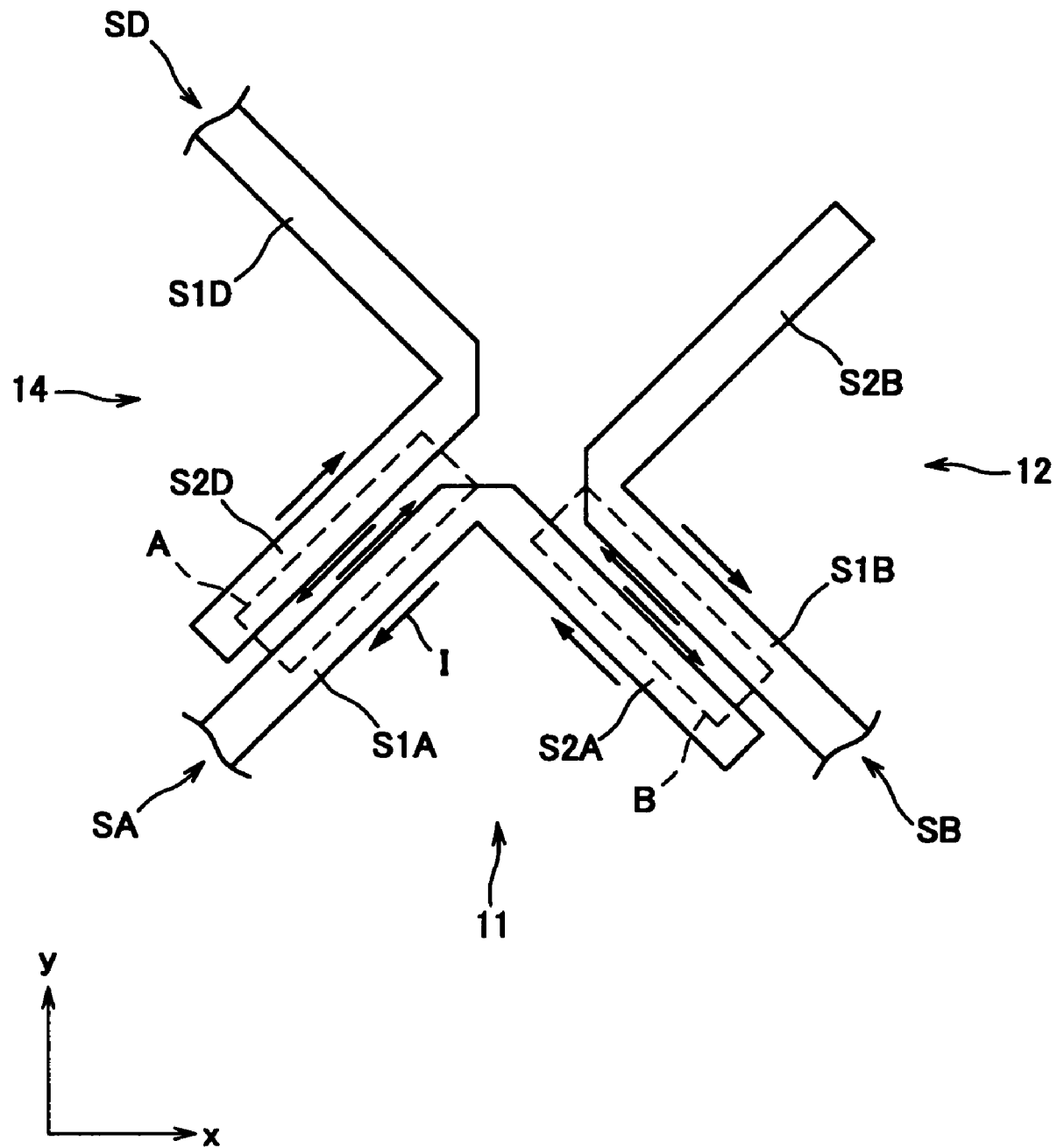
FIG. 2B is an explanatory view describing an operation example of the radiation level reducing device according to the embodiment.

The radiation level reducing device 100 according to the present embodiment includes a plurality of slits SA to SD formed from the intense electric field positions VA to VD, as described above. In such slits SA to SD, each drawing slit S1A to S1D is formed from the intense electric field position VA to VD. The intense electric field positions VA to VD are positions where the electric field is stronger than other sites, and a voltage E generates, as shown in FIG. 2A, between the edges of the drawing slits S1A to S1D by forming the drawing slits S1A to S1D at the intense electric field positions VA to VD. In other words, the radiation electric field component of the electromagnetic wave generated by the noise generation source R couples at the intense electric field positions VA to VD to the drawing slits S1A to S1D and excites the voltage E. The voltage E is guided towards the central part O side of the cover region Ar along the drawing slits S1A to S1D while being coupled to the drawing slits S1A to S1D. The circular current I is divided by the drawing slits S1A to S1D, and is guided towards the central part O side with the voltage E, as shown in FIG. 2A, with the coupling of the voltage E, which is one generation source thereof, to the drawing slits S1A to S1D. As shown in FIG. 2B, the circular current I guided towards the central part O side by the drawing slits S1A to S1D is guided to between another slit adjacent on one side in the peripheral direction by the coupling slit S2A to S2D. Therefore, the circular current I flows at the edge portion of each slit SA to SD.

As shown in FIG. 2B, the circular current I flowing the edge portion of each slit SA to SD has an opposite phase to the circular current I guided by the adjacent slit. Therefore, the circular currents I of opposite phases cancel each other out at the region A and the region B where two slits SA to SD become parallel. That is, the circular current I is canceled out and attenuated at two regions A, B, as can be seen from one slit. As a result, the radiation level reducing device 100 according to the present embodiment can reduce the noise N of the secondary radiation and the like.

2-2-2. Radiation Electric Field Component Attenuating Operation

Figure 3A:
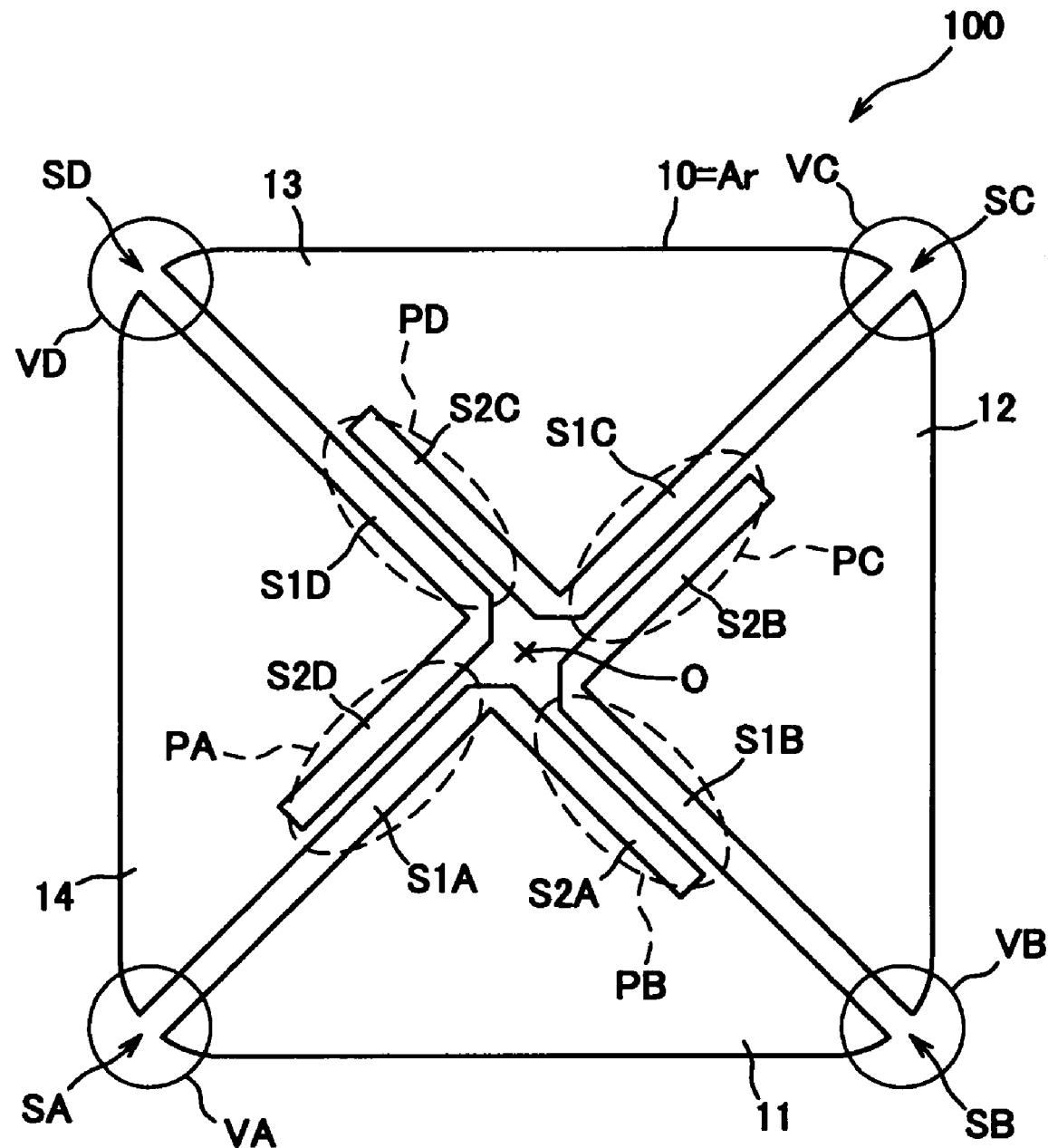
FIG. 3A is an explanatory view describing an operation example of the radiation level reducing device according to the embodiment.
Figure 3B:
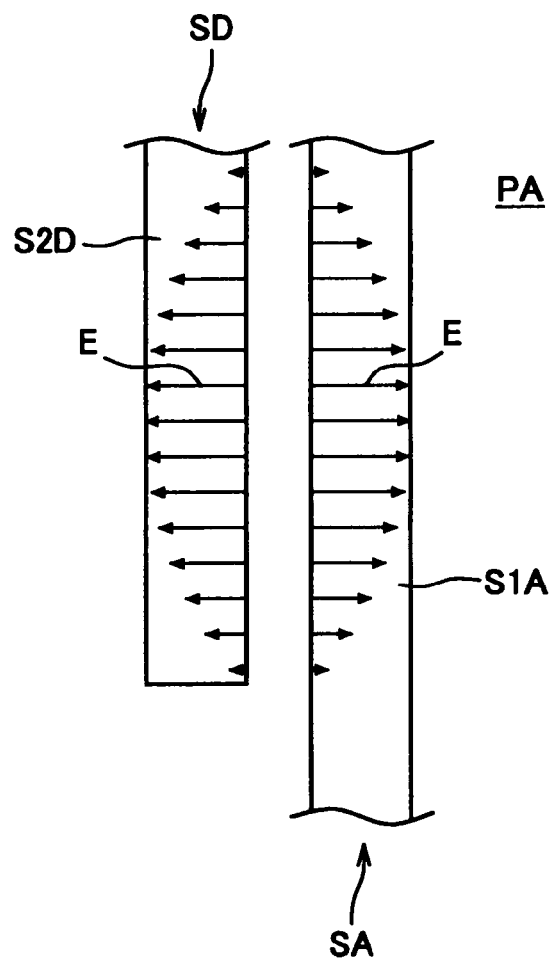
FIG. 3B is an explanatory view describing an operation example of the radiation level reducing device according to the embodiment.

The radiation electric field component that generates the voltage E by coupling to each slit SA to SD is guided along each slit SA to SD from the intense electric field positions VA to VD, as described above. Each slit SA to SD couples not only the radiation electric field component from the intense electric field positions VA to VD, but also the radiation electric field component at other locations and generates the voltage E. The voltage E generated in each slit SA to SD has an opposite phase, as shown in FIG. 3B, at parallel positions PA to PD shown in FIG. 3A, and thus cancel each other out. Therefore, the noise N of the secondary radiation by the voltage E generated at the respective slit SA to SD also becomes an opposite phase at the parallel positions PA to PD and cancels each other out, whereby the noise N is further reduced.

2-2-3. Remaining Secondary Radiation Component Attenuating Operation

Furthermore, the still remaining secondary radiation component generates even by the circular current attenuating operation and the radiation electric field component attenuating operation. However, as shown in FIG. 3A, since each slit SA to SD is formed point symmetrically in the present embodiment, the noises N generated by the opposing slits SA to SD (slit SA and slit SC or slit SB and slit SD) have substantially the same amplitude and have opposite phases. As a result, the noise N of the secondary radiation component cancels each other out even if supposedly radiated. More specifically, the secondary radiation component radiated from the parallel position PA becomes an opposite phase to the secondary radiation component radiated from the parallel position PC thereby canceling each other out, and the secondary radiation component radiated from the parallel position PB becomes an opposite phase to the secondary radiation component radiated from the parallel position PD thereby canceling each other out. The noise N is thus further reduced.

Therefore, the radiation level reducing device 100 according to the present embodiment can reduce the radiation level of noise N by realizing the circular current attenuating operation, the radiation electric field component attenuating operation, and the remaining secondary radiation component reducing operation with the arrangement of the slits SA to SD. Such operations, however, are merely examples and the radiation level reducing device 100 is not limited to such operations, and the existence of operations not mentioned herein and the possibility of reducing the noise N by such operations are not to be excluded.

The operation examples of the radiation level reducing device 100 according to the first embodiment of the present invention have been described above.

An example of the radiation level reducing device according to the first embodiment of the present invention will now be described with reference to FIGS. 4 to 6B. FIGS. 4 to 6B are explanatory views for describing the example of the radiation level reducing device according to the present embodiment.

2-3. Example of Radiation Level Reducing Device

Figure 4:
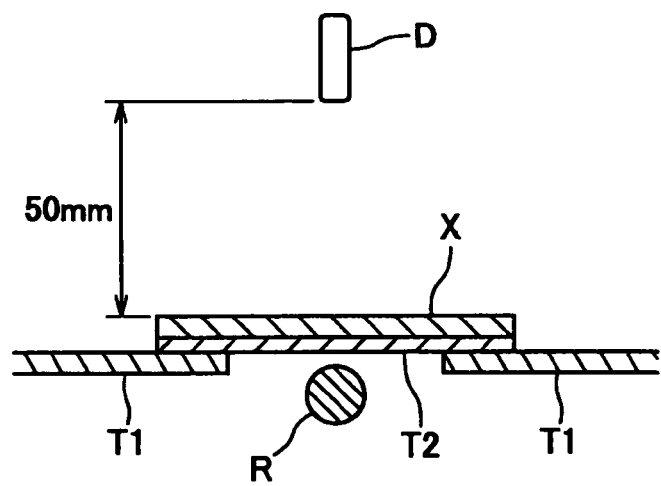
FIG. 4 is an explanatory view describing an example of the radiation level reducing device according to the embodiment.

In measuring the radiation level reducing effect by the radiation level reducing device according to the present embodiment, a measurement device imitating a print substrate as shown in FIG. 4 is prepared. More specifically, a vinyl film T2 is arranged at the lower surface of a measuring target X, which vinyl film T2 is arranged on a supporting plate T1 so as to block an opening of the supporting plate T1. The electromagnetic wave is generated from the noise generation source R while changing the frequency, and the noise N (electric field distribution) radiated from the measuring target X is measured by a reception probe D spaced apart by 50 mm from the measuring target X.

Figure 5A:
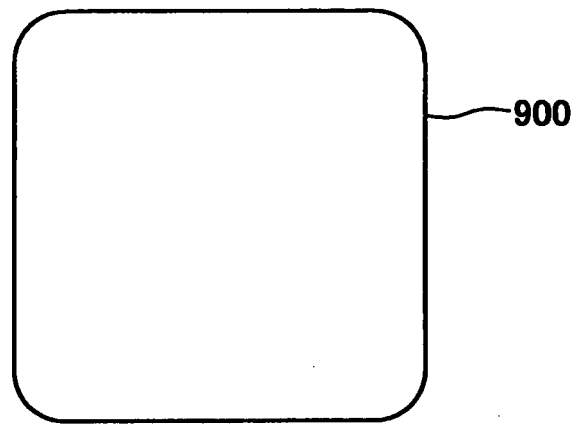
FIG. 5A is an explanatory view describing an example of the radiation level reducing device according to the embodiment.
Figure 5A:
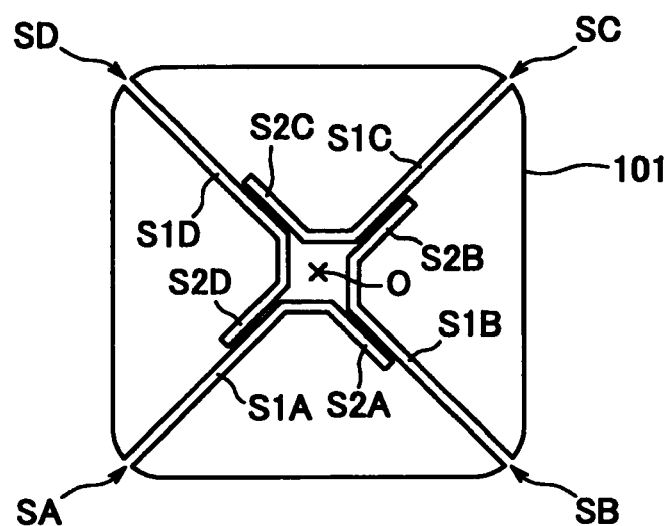
Figure 5A:
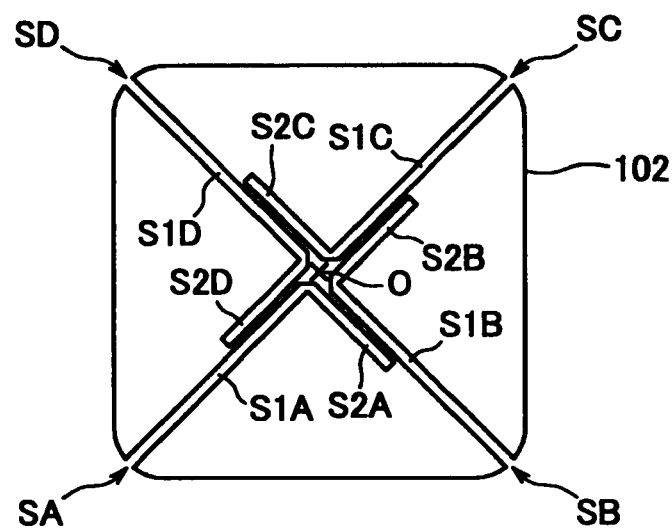

As shown in FIG. 5A, a radiation level reducing device 900 according to the related art without slits and the radiation level reducing devices 101, 102 according to the present embodiment are prepared and arranged at the position of the measuring target X, and the radiation level of the noise N is measured by the measurement device.

The radiation level reducing devices 101, 102 according to the present embodiment are respectively formed with the slits SA to SD of different size, as shown in FIG. 5A. That is, the metal plate 10 is obtained by forming a copper plate having a thickness of 0.09 mm to a square of 40 mm×40 mm, and the slits SA to SD having a slit width of 0.8 mm are formed in the metal plate 10. The material of the metal plate 10 is not particularly limited as long as it has conductivity, and effects similar to those described below can be obtained even with other materials.

In this case, the length of the drawing slits S1A to S1D of the radiation level reducing device 101 is 25 mm, and the length of the coupling slits S2A to S2D is 13 mm. The length of the drawing slits S1A to S1D of the radiation level reducing device 102 is 25 mm, and the length of the coupling slits S2A to S2D is 15 mm. The slit interval (i.e., interval between adjacent slits) at the parallel positions PA to PD is 0.6 mm. The angle between the drawing slit S1A to S1D and the coupling slit S2A to S2D in each slit SA to SD is 90°. The slits SA to SD have a shape rotated 90° with respect to each other (i.e. four-fold symmetry of 90°) with the central part O of the cover region Ar (i.e., metal plate 10) as a reference so as to be formed to a substantially cross-shape as a whole. The radiation level reducing device 900 according to the related art uses the metal plate 90 similar to the metal plate 10.

Figure 5C:
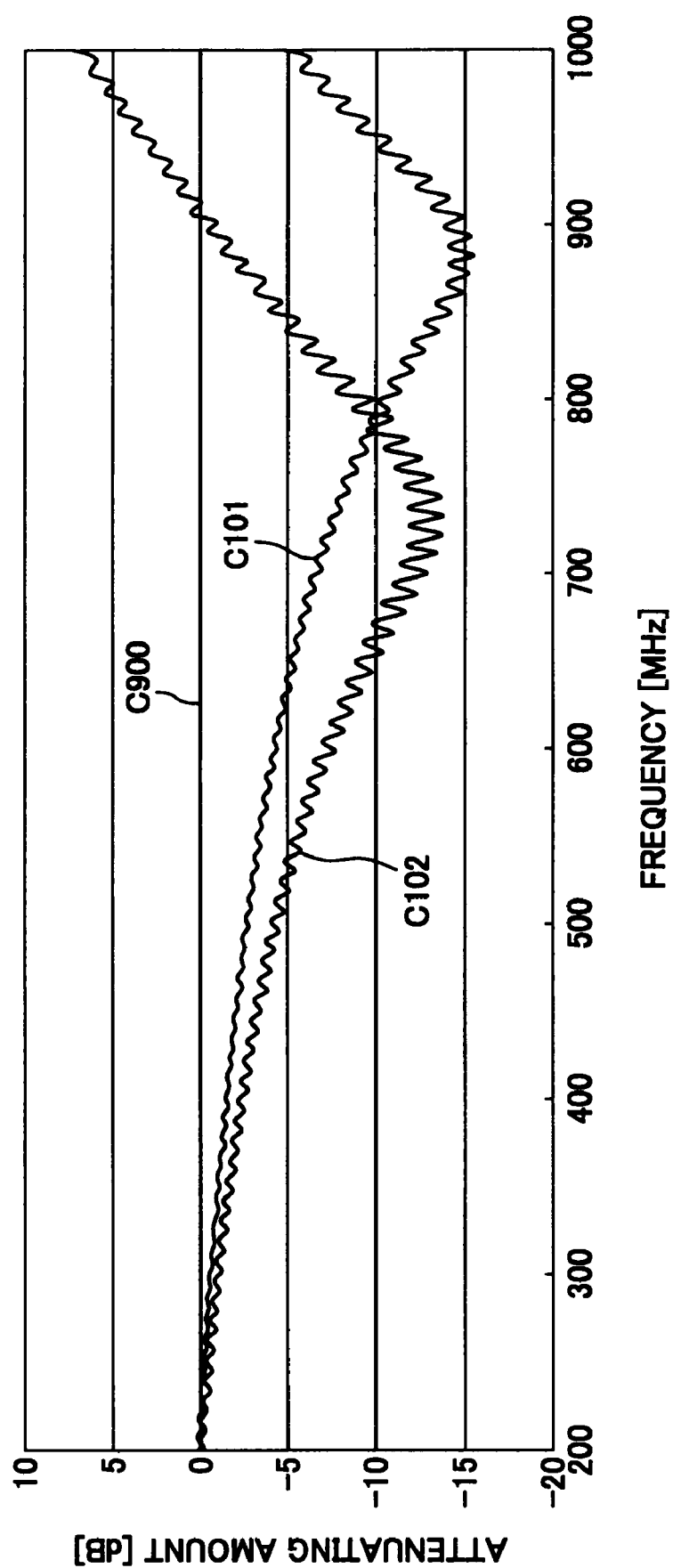
FIG. 5C is an explanatory view describing an example of the radiation level reducing device according to the embodiment.

FIG. 5B shows the measurement result in which measurement signals 1101, 1102 with respect to the radiation level reducing devices 101, 102 according to the present embodiment are standardized with a measurement signal 1900 with respect to the radiation level reducing device 900 according to the related art as 0 dB. FIG. 5C shows the result in which simulations results C101, C102 with respect to the radiation level reducing devices 101, 102 are standardized with a simulation result C900 with respect to the radiation level reducing device 900 according to the related art as 0 dB using an electromagnetic field simulator.

Generally, as the slits SA to SD are opened in the metal plate 10, the electromagnetic wave leaked therefrom is added to the secondary radiation component, and thus the level of noise N is assumed to degrade in the radiation level reducing devices 101, 102 according to the present embodiment compared to the radiation level reducing device 900 according to the related art. Therefore, the measurement signals 1101, 1102 by the radiation level reducing devices 101, 102 are generally expected to become higher than the measurement signal 1900 with respect to the radiation level reducing device 900 according to the related art.

However, the radiation level reducing devices 101, 102 according to the present embodiment can greatly reduce the secondary radiation component (noise N) in a wide range of electromagnetic wave frequency band, contrary to one's expectations, as apparent not only from FIG. 5B but also from FIG. 5C. This is because the radiation level reducing devices 101, 102 can greatly reduce the secondary radiation by drawing in the radiation component into the slits SA to SD and mutually interfering and cancelling out the same using a plurality of slits SA to SD.

Figure 6A:
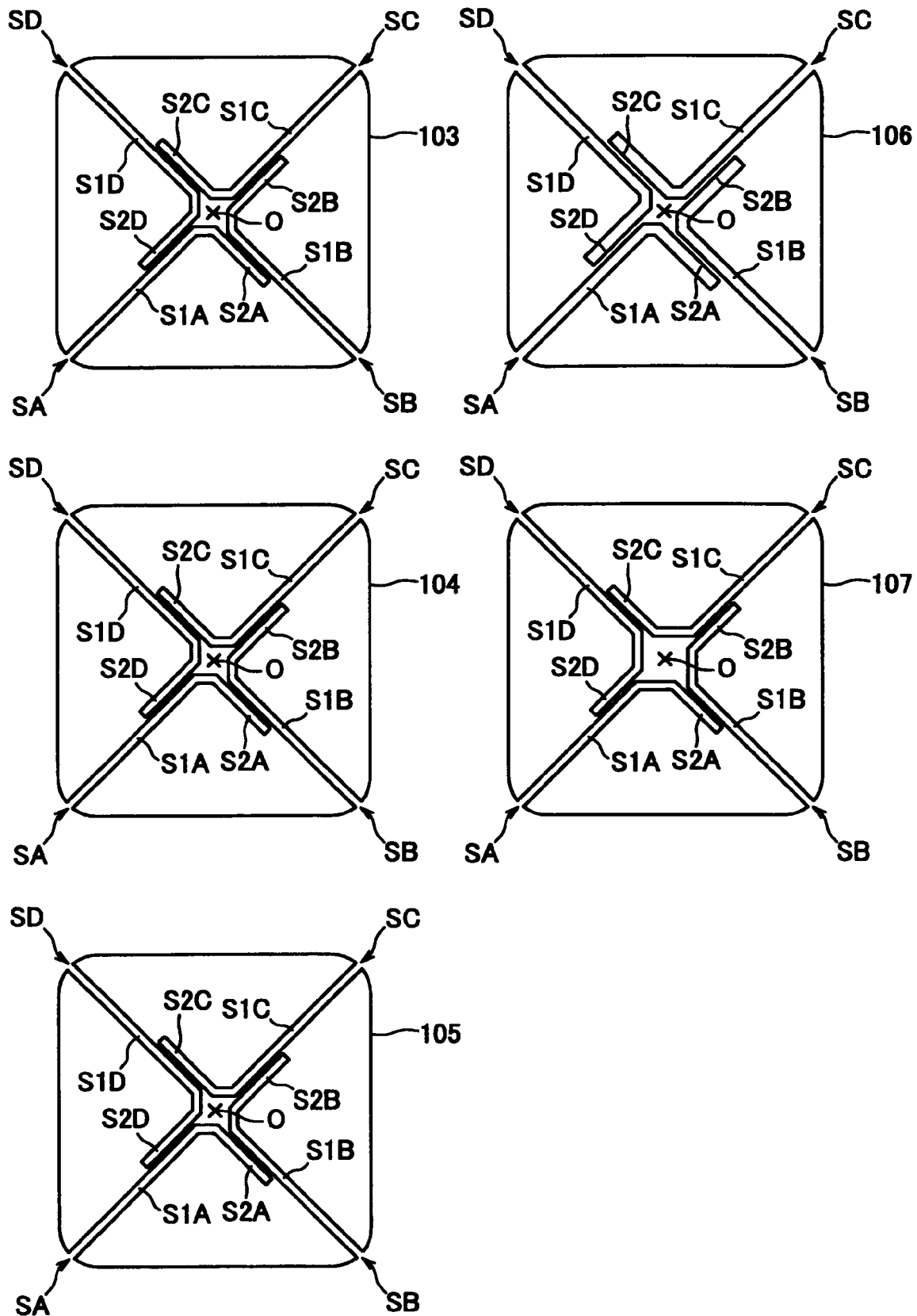
FIG. 6A is an explanatory view describing an example of the radiation level reducing device according to the embodiment.

As shown in FIG. 6A, radiation level reducing devices 103 to 107 according to the present embodiment, in which the dimension of the slits SA to SD is appropriately changed in the metal plate 10 similar to the above, are prepared, and the measurement similar to the above is carried out.

In this case, the radiation level reducing device 103 has a slit width of 1.0 mm, the length of the drawing slits S1A to S1D of 25 mm, the length of the coupling slits S2A to S2D of 15 mm, and the slit interval at the parallel positions PA to PD of 0.4 mm. The radiation level reducing device 104 has a slit width of 1.2 mm, the length of the drawing slits S1A to S1D of 25 mm, the length of the coupling slits S2A to S2D of 13 mm, and the slit interval at the parallel positions PA to PD of 0.6 mm. The radiation level reducing device 105 has a slit width of 0.8 mm, the length of the drawing slits S1A to S1D of 25 mm, the length of the coupling slits S2A to S2D of 11 mm, and the slit interval at the parallel positions PA to PD of 0.4 mm. The radiation level reducing device 106 has a slit width of 1.0 mm, the length of the drawing slits S1A to S1D of 25 mm, the length of the coupling slits S2A to S2D of 13 mm, and the slit interval at the parallel positions PA to PD of 0.2 mm. The radiation level reducing device 107 has a slit width of 1.4 mm, the length of the drawing slits S1A to S1D of 25 mm, the length of the coupling slits S2A to S2D of 15 mm, and the slit interval at the parallel positions PA to PD of 0.6 mm.

FIG. 6B shows the measurement results in which measurement signals 1103 to 1107 with respect to the radiation level reducing devices 103 to 107 are standardized with the measurement signal 1900 with respect to the radiation level reducing device 900 according to the related art as 0 dB.

Even if the dimensions of the slits SA to SD differ, the measurement results of FIG. 6B also show that the radiation level reducing devices 103 to 107 according to the present embodiment can realize the secondary radiation (noise N) reducing effect by having the slits SA to SD reliably couple the radiation component.

The example of the radiation level reducing device according to the first embodiment of the present invention has been described above.

An implementation example of the radiation level reducing device according to the first embodiment of the present invention will now be described with reference to FIGS. 7A to 7F. FIGS. 7A to 7F are explanatory views describing an implementation example of the radiation level reducing device according to the present embodiment.

2-4. Implementation Example of Radiation Level Reducing Device

The radiation level reducing device 100 according to the first embodiment of the present invention can be formed with a very simple configuration in which the slits SA to SD are formed in the metal plate 10, as described above. In particular, the radiation level reducing device 100 is not particularly subjected to limitation on the arrangement position and is simply arranged near the noise generation source R as it does not even need to be grounded, thereby enabling various implementations. Some of the implementation examples of the radiation level reducing device 100 will be described below.

2-4-1. First Implementation Example

Figure 7A:
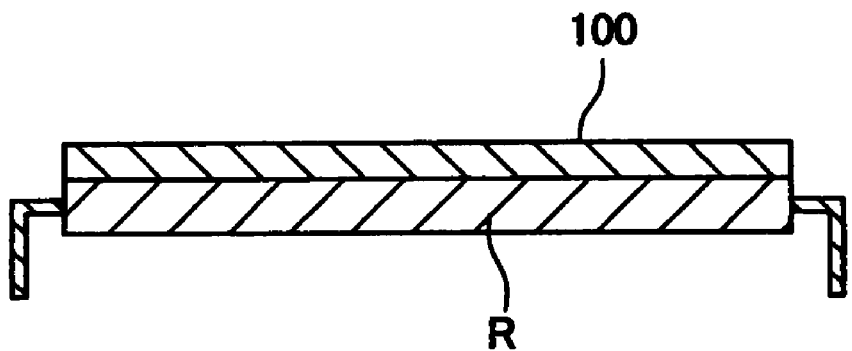
FIG. 7A is an explanatory view describing an implementation example of the radiation level reducing device according to the embodiment.

FIG. 7A shows a case in which the radiation level reducing device 100 according to the present embodiment is directly printed on the upper surface of the noise generation source R. In this case, the radiation level reducing device 100 may be embedded inside the noise generation source R instead of the upper surface of the noise generation source R. The radiation level reducing device 100 can be easily configured and the radiation level of noise N with respect to one surface side of the noise generation source R can be greatly reduced by directly printing the radiation level reducing device 100 on the noise generation source R. In this case, an insulating protective layer of about 0.05 mm is desirably formed between the noise generation source R and the radiation level reducing device 100.

2-4-2. Second Implementation Example

Figure 7B:
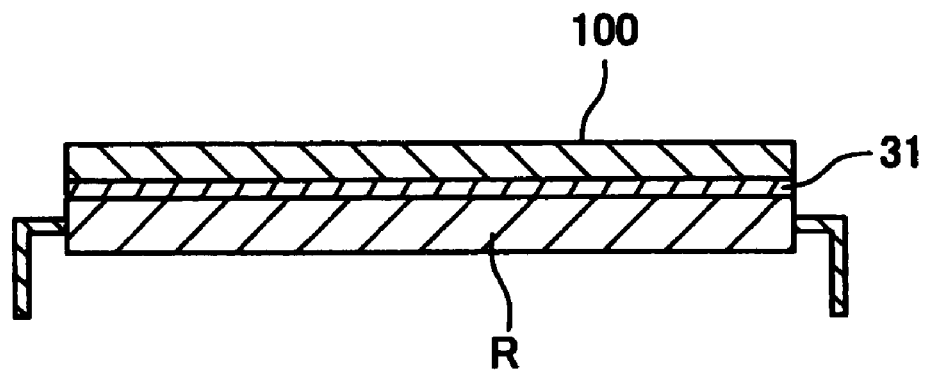
FIG. 7B is an explanatory view describing an implementation example of the radiation level reducing device according to the embodiment.

FIG. 7B shows a case in which the radiation level reducing device 100 is fixed on the upper surface of the noise generation source R with an adhesive 31 (may be seal with adhesive), as an implementation example of the radiation level reducing device 100 integrally formed with the noise generation source R, similar to the first implementation example. In this case, a raw material having insulating property is desirably used for the adhesive 31 and the like.

2-4-3. Third Implementation Example

Figure 7C:
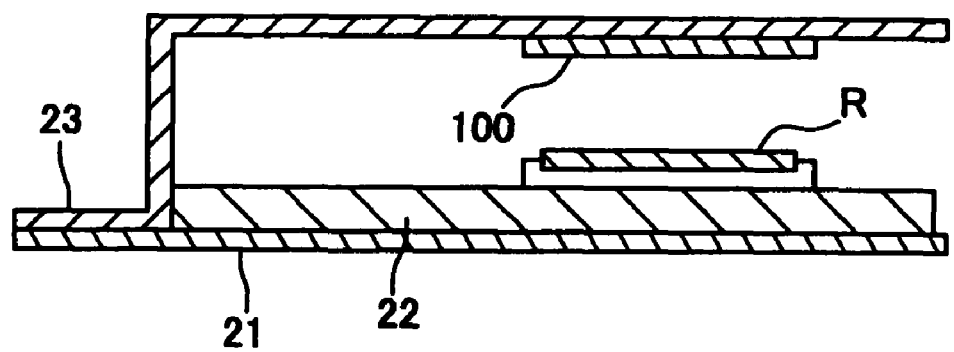
FIG. 7C is an explanatory view describing an implementation example of the radiation level reducing device according to the embodiment.

FIG. 7C shows a case in which the radiation level reducing device 100 according to the present embodiment is fixed to a shield case 23. The noise generation source R is arranged on a substrate 22 and is covered by shield cases 21, 23. The radiation level reducing device 100 is fixed at the interior with an adhesive, a seal (not shown), and the like at a position facing the noise generation source R of the shield case 23 at the upper side. The radiation level reducing device 100 may obviously be fixed to the upper side of the shield case 23. The radiation level reducing device 100 thus can be arranged near the noise generation source R in any manner since the arrangement position is not limited. Furthermore, the radiation level reducing device 100 can be easily arranged since grounding and the like is not necessary and a fixing means is not particularly a problem.

2-4-4. Fourth Implementation Example

Figure 7D:
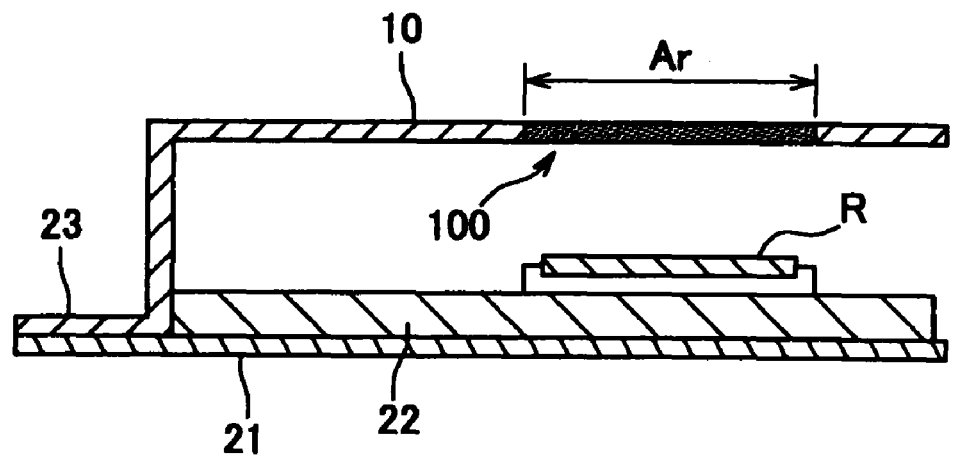
FIG. 7D is an explanatory view describing an implementation example of the radiation level reducing device according to the embodiment.

FIG. 7D shows a case in which the radiation level reducing device 100 according to the present embodiment is formed as one part of the shield case 23. In this case, a site covering the noise generation source R of the shield case 23 is the metal plate 10, and the position facing the noise generation source R of the metal plate 10 is the cover region Ar. The slits SA to SD are formed in the cover region Ar. In this case, the radiation level reducing device 100 according to the present embodiment can be formed by simply forming the slits SA to SD in the shield case 23.

2-4-5. Fifth Implementation Example

Figure 7E:
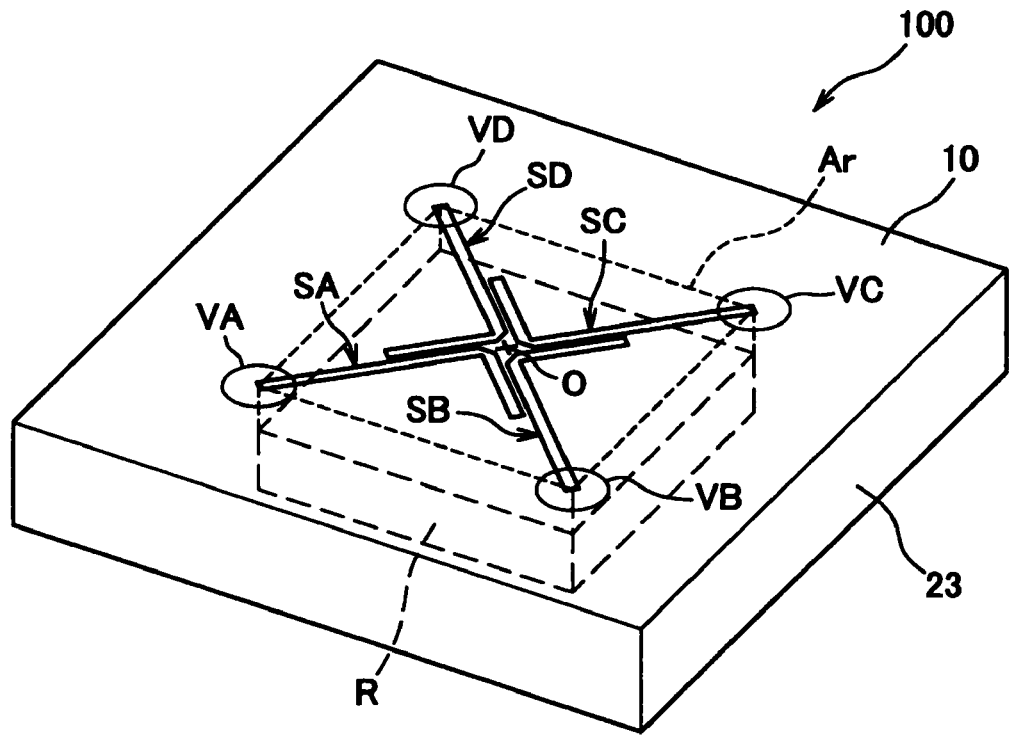
FIG. 7E is an explanatory view describing an implementation example of the radiation level reducing device according to the embodiment.

FIG. 7E shows a case in which the radiation level reducing device 100 according to the present embodiment is directly formed in the shield case 23 and the metal plate 10 is much larger than the cover region Ar covering the noise generation source R. similar to the fourth implementation example. In this case, since the cover region Ar and the metal plate 10 do not match, the outer periphery (corner) of the cover region Ar corresponding to the corner of the upper surface of the noise generation source R becomes the intense electric field positions VA to VD, and the slits SA to SD are formed from the intense electric field positions VA to VD, similar to the fourth implementation example.

2-4-6. Sixth Implementation Example

Figure 7F:
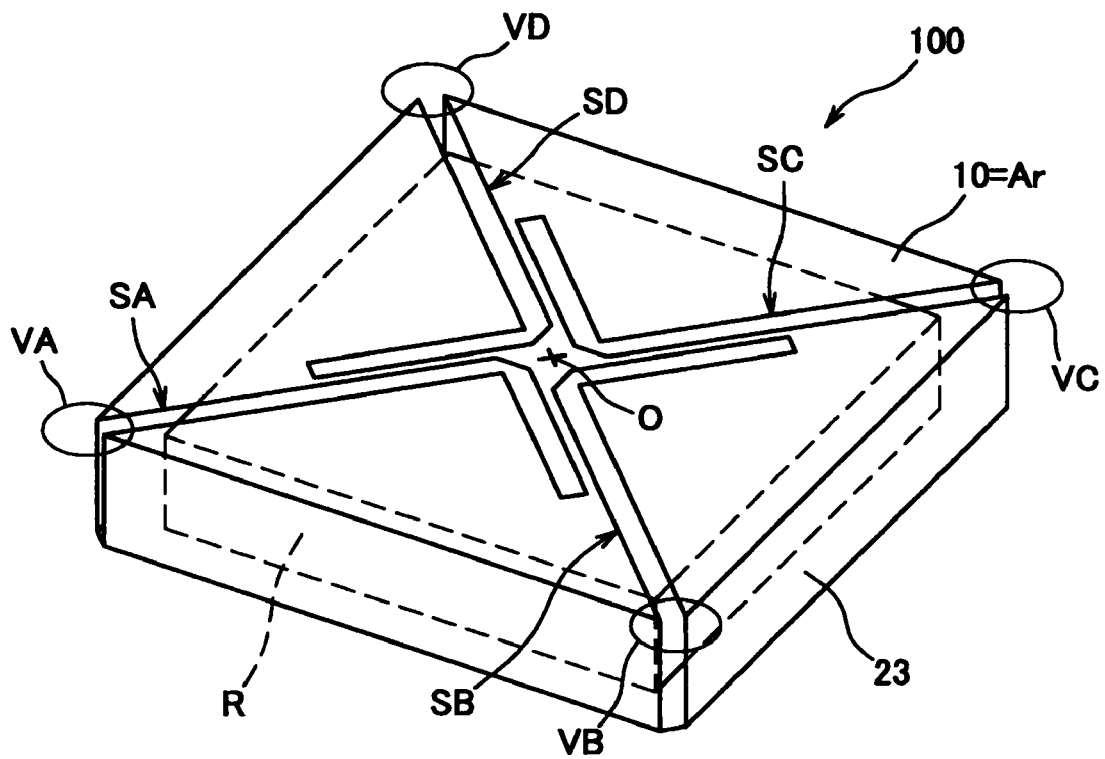
FIG. 7F is an explanatory view describing an implementation example of the radiation level reducing device according to the embodiment.

FIG. 7F shows a case in which the radiation level reducing device 100 according to the present embodiment is directly formed in the shield case 23, but the cover region Ar covering the noise generation source R is substantially the same extent as the metal plate 10, different from the fifth implementation example. In this case, the corners of the metal plate 10 become the corners of the cover region Ar, and also become the intense electric field positions VA to VD. Thus, the slits SA to SD are formed from the corners of the metal plate 10. As shown in FIG. 7F, the slits SA to SD are desirably formed extending to the corner portion of the side surface different from the metal plate 10 in the shield case 23 to more effectively guide the circular current I to the central part O. This is similar in the case of the fifth implementation example. Therefore, in the fifth implementation example, the circular current I can be more effectively guided to the central part O as the slits SA to SD of FIG. 7E are extended to the end of the metal plate 10 or the vicinity thereof beyond the cover region Ar.

The implementation examples of the radiation level reducing device 100 according to the first embodiment of the present invention have been described above. The implementation examples described herein are merely examples, and the application of the radiation level reducing device 100 is not to be limited to such implementation examples. As described above, various other implementations can be carried out since the radiation level reducing device 100 is formed with a very simple configuration and the arrangement position thereof is not limited.

2-5. Variant of Radiation Level Reducing Device

A variant of the radiation level reducing device 100 according to the first embodiment of the present invention will now be described with reference to FIGS. 8A to 8E. FIGS. 8A to 8E are explanatory views describing variants of the radiation level reducing device according to the present embodiment.

2-5-1. Number of Slits and Arrangement Position (Point Symmetric)

As described above, the radiation level reducing device 100 according to the present embodiment can reduce the noise N by realizing the circular current attenuating operation, the radiation electric field component attenuating operation, the residual secondary radiation component attenuating operation, and the like with the arrangement of the plurality of slits SA to SD. The circular current attenuating operation and the radiation electric field component attenuating operation are realized when the adjacent slits draw in the circular current I or the voltage E of opposite phases with respect to each other in the central part O direction, as described in FIGS. 2A, 2B, and 3B. Two or more slits are to be formed to realize the circular current attenuating operation and the radiation electric field component attenuating operation.

However, as described in FIG. 3A, the residual secondary radiation component attenuating operation is realized when the noises N generated from each slit SA to SD become opposite phases at substantially the same amplitude. To this end, the number of slits to be formed is desirably $2^N$, N being a positive integer, in relation to the phase. To further enhance the cancelling effect by equalizing the amplitude of the noises N of opposite phases, the plurality of slits is desirably formed point symmetrically with the central part O of the cover region Ar as a reference. That is, describing the number of slits and the arrangement position together, $2^N$ slits are formed, and the slits are desirably formed $2^N$ fold symmetrically with the central part O of the cover region Ar as a reference.

Figure 8A:
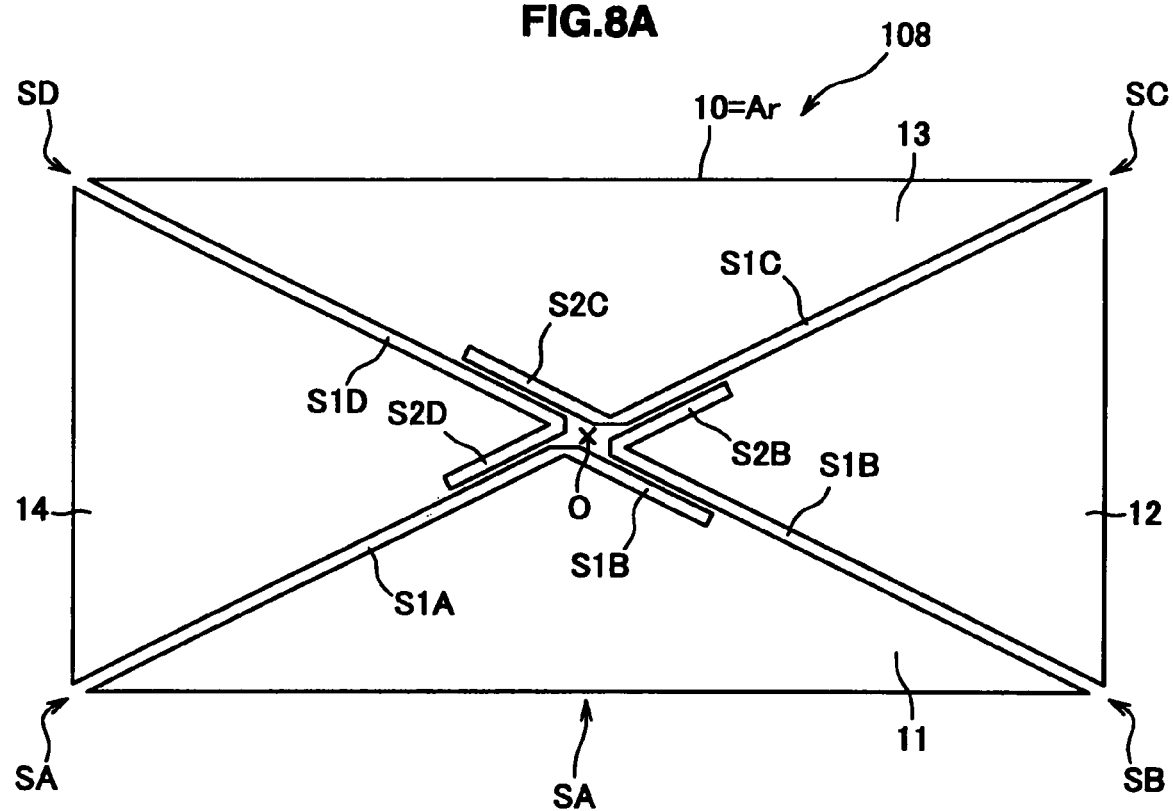
FIG. 8A is an explanatory view describing a variant of the radiation level reducing device according to the embodiment.

The circular current attenuating operation, the radiation electric field component attenuating operation, the residual secondary radiation component attenuating operation, and the like are realized to the same extent for when the number of slits is N=2 and for when N is greater than 2. Therefore, in view of the increase in the slit forming steps due to the increase in the number of slits, and the reduction in the mechanical strength of the radiation level reducing device 100, the number of slits is desirably N=2, that is, four. Taking into consideration that each slit is formed point symmetrically, the slits SA to SD may be formed in a rectangular metal plate 10, as shown in FIG. 8A. However, the four-fold symmetric slits SA to SD as in the present embodiment shown in FIG. 1A are desirably formed to isotropically realize the cancelling effect by equalizing the level of circular currents I to cancel out, the amplitude of the voltages E, the amplitude of the noises N of opposite phases, and the like.

Figure 8B:
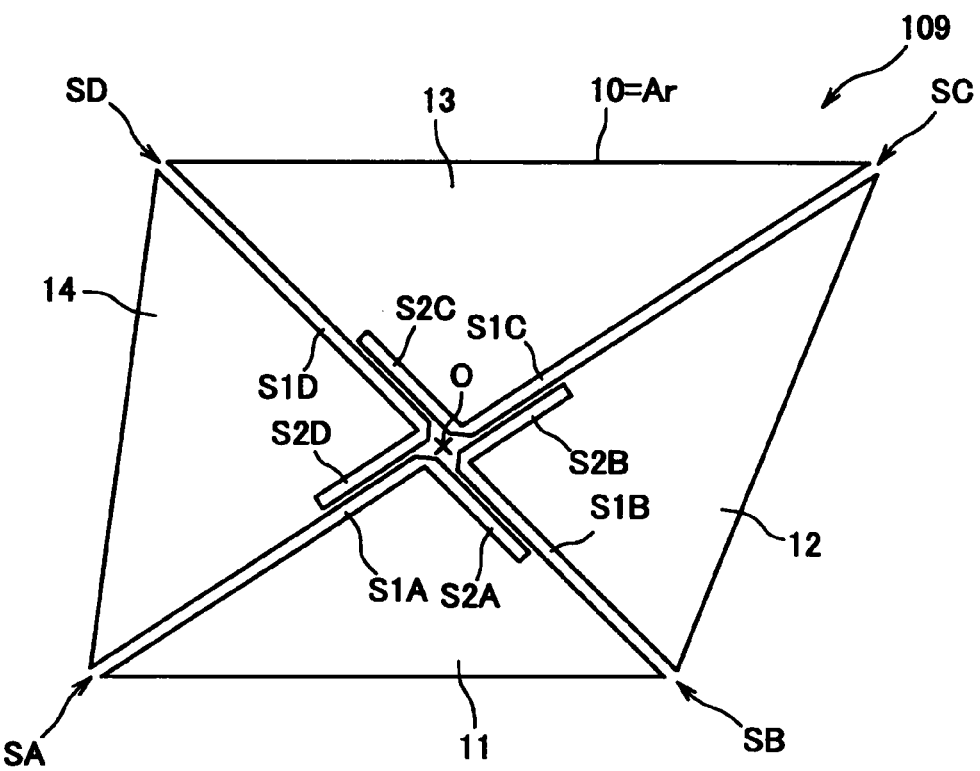
FIG. 8B is an explanatory view describing a variant of the radiation level reducing device according to the embodiment.

However, the circular current attenuating operation, the radiation electric field component attenuating operation, and the like can be realized even if the slit is formed in plurals other than $2^N$. It is to be note that the circular current attenuating operation, the radiation electric field component attenuating operation, the residual secondary radiation component attenuating operation, and the like can be realized even if the plurality of slits is not formed point symmetrically, as shown in FIG. 8B. In this case, the central part O of the cover region Ar may be an intersection of the diagonal lines of each corner of the metal plate 10 or a barycentric position of the metal plate 10.

2-5-2. Shape of Metal Plate

The slit is formed from the intense electric field position of the cover region Ar towards the central part O, as described above. In this case, if the metal plate 10 is significantly larger than the cover region Ar (e.g., greater than or equal to 1.5 times), the intense electric field position becomes the position at the outer periphery of the cover region Ar corresponding to the corner of the upper surface of the noise generation source R, as shown in FIGS. 7D and 7E. However, if the cover region Ar is substantially the entire region of the metal plate 10, the intense electric field position corresponds to the corner of the metal plate 10.

The number of slits formed is desirably $2^N$, N being a positive integer, in relation to the phase to sufficiently realize the residual secondary radiation component attenuating operation. Therefore, the intense electric field position formed with the slit is desirably arranged by the number of the same extent. To this end, the metal plate 10 is desirably formed to a polygon in which $2^M$ corners are formed at the outer periphery, where M is a positive integer of greater than or equal to two. Therefore, the metal plate 10 desirably has a 4-, 8-, 16-, 32 polygon shape etc. to sufficiently realize the residual secondary radiation component attenuating operation. Similar to desirably forming the slits point symmetrically to further enhance the cancelling effect by equalizing the amplitude of the noise N of opposite phases, the metal plate is also desirably formed point symmetrically. Furthermore, similar to desirably forming the slits SA to SD four-fold symmetrically to isotropically realize the cancelling effect, the metal plate 10 is desirably a regular polygon.

Figure 8C:
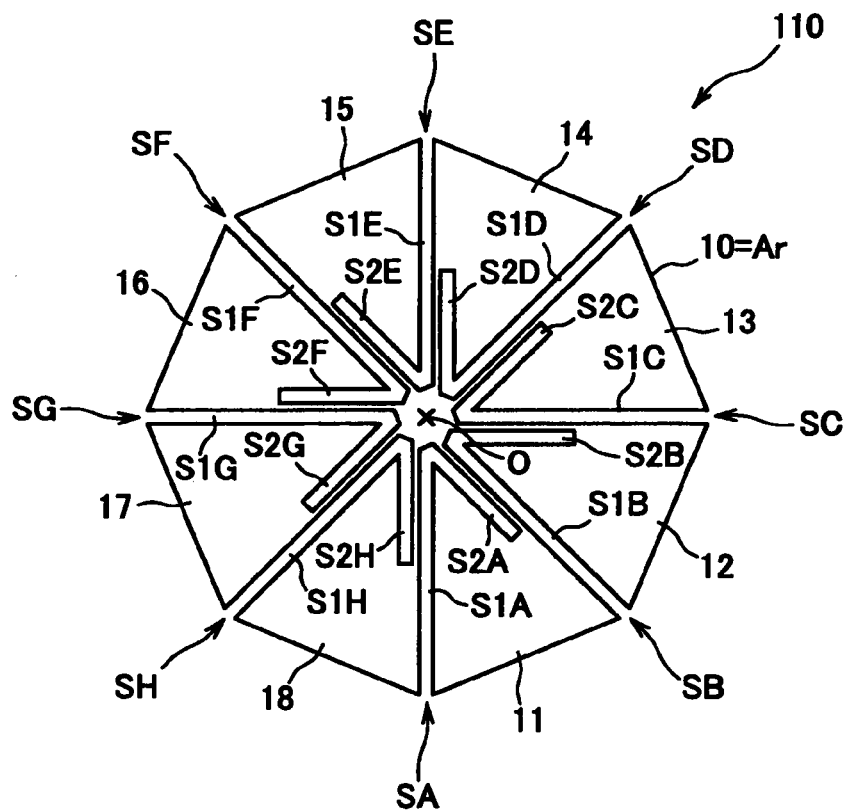
FIG. 8C is an explanatory view describing a variant of the radiation level reducing device according to the embodiment.
Figure 8D:
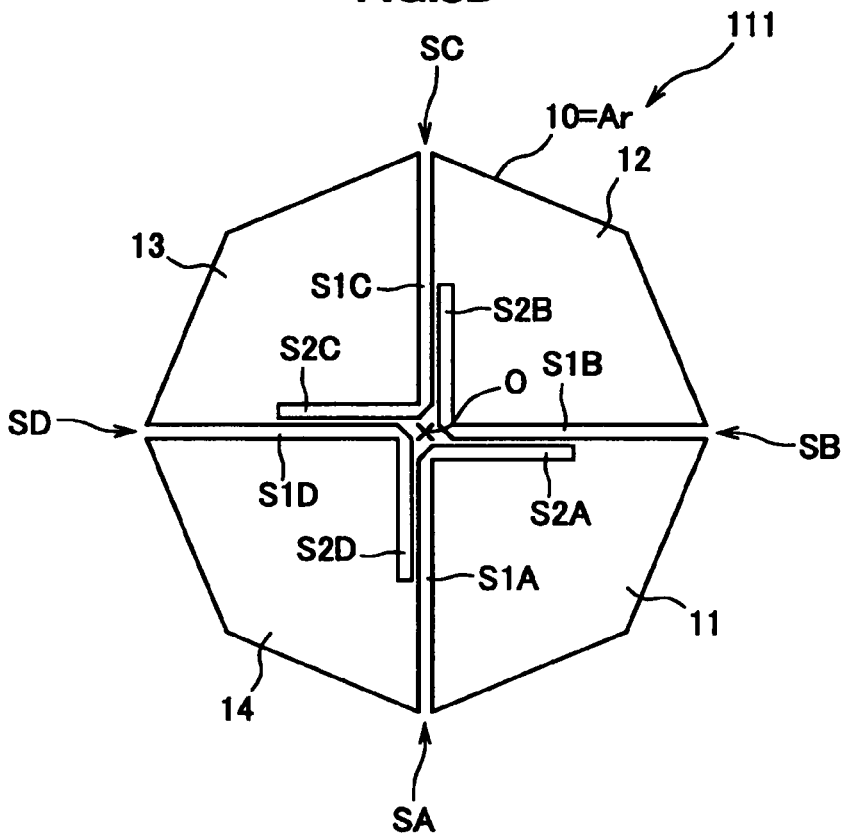
FIG. 8$d$ is an explanatory view describing a variant of the radiation level reducing device according to the embodiment.
FIG. 8E is an explanatory view describing a variant of the radiation level reducing device according to the embodiment.
FIG. 8F is an explanatory view describing a variant of the radiation level reducing device according to the embodiment.

An example of a case in which the metal plate 10 is formed to a regular polygon is shown in FIGS. 8C and 8D. In FIGS. 8C and 8D, the metal plate 10 is formed to a regular octagon. In FIG. 8C, eight slits SA to SH are formed in eight-fold symmetry to satisfy the above relationship. However, the number of slits may not match the number of corner portions of the metal plate 10, and thus four slits SA to SD may be formed at four-fold symmetry, as shown in FIG. 8D.

Figure 8E:
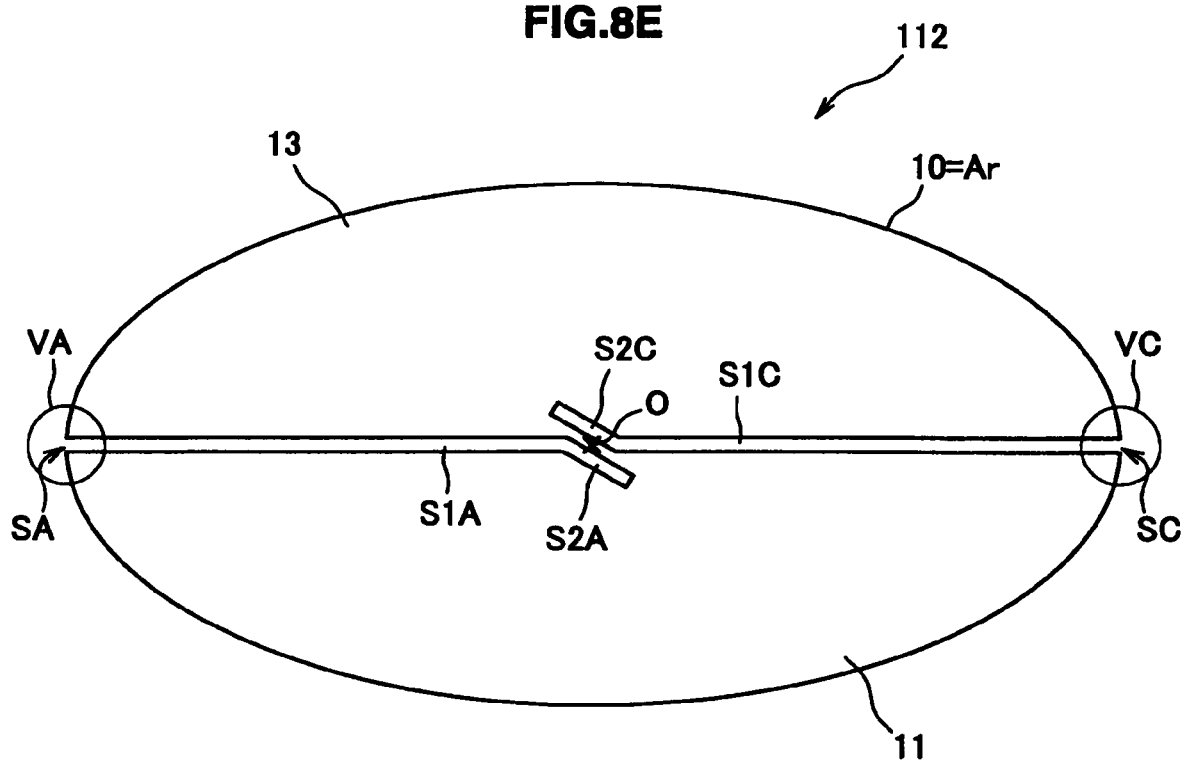

If the metal plate 10 does not have a corner or is formed to a shape in which the center distance from the central part O to the outer periphery is unequal as with an ellipse shown in FIG. 8E, the intense electric field positions VA, VC become edge positions which center distance is long compared to other sites. Therefore, in this case, the plurality of slits SA, SC are formed from the intense electric field positions VA, VC, which are edge positions, as shown in FIG. 8E.

Figure 8F:
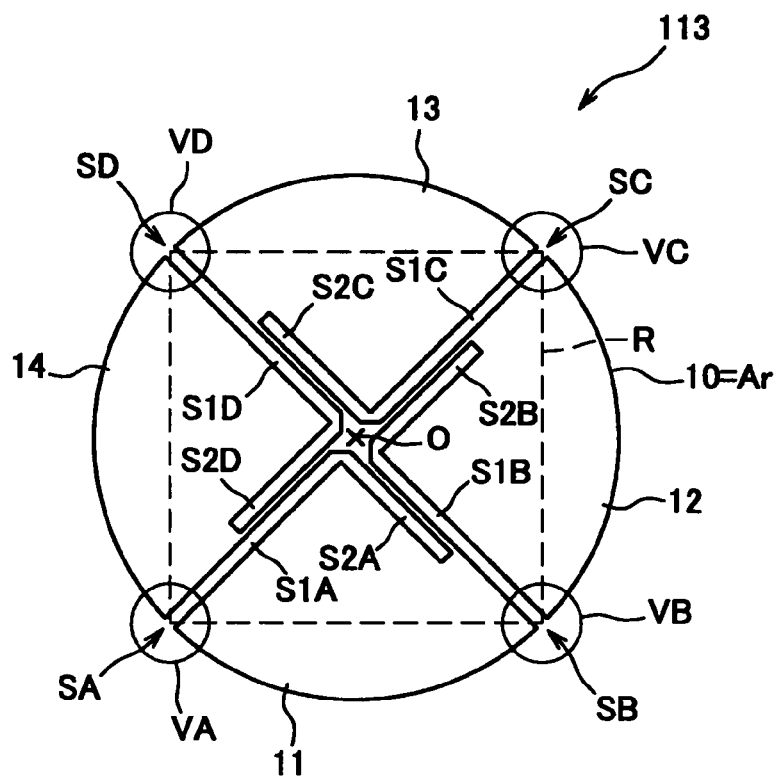

If the metal plate 10 is formed without such edge position as with a circle shown in FIG. 8F, the intense electric field positions VA to VD become positions at the outer periphery of the cover region Ar (i.e., metal plate 10) corresponding to the corner of the upper surface of the noise generation source R, similar to FIG. 7E and the like. Therefore, in this case, the plurality of slits SA to SD are formed from the intense electric field positions VA to VD, as shown in FIG. 8F.

2-6. Example of Effects of Radiation Level Reducing Device

The radiation level reducing device 100 according to the present embodiment of the present invention has been described above.

According to such radiation level reducing device 100, the radiation noise component generated at the upper part of a site can be divided and acted to cancel out by simply being loaded on the upper surface of the noise generation source R. Therefore, the electromagnetic wave generated from the noise generation source R can be effectively suppressed while reducing the generation of noise N of the secondary radiation and the like. In this case, the canceled electromagnetic wave energy is absorbed as heat.

The radiation level reducing device 100 can be easily arranged with an adhesive, a seal, and the like, and can be easily arranged since the task that may lower the assembly task efficiency such as screw-fitting task is not carried out. The manufacturing cost is also expected to greatly reduce since the radiation level reducing device 100 can be formed with a simple structure.

As described above, the radiation level reducing device 100 can be loaded freely without being subjected to limitation on the arrangement position since grounding is not even necessary. Therefore, the level reducing device 100 can be appropriately arranged near a plurality of noise generation sources R, the electromagnetic wave of which is desirably reduced, and the noise can be appropriately reduced even in a state where a wide variety of noise generation sources is present. It is to be noted that use can be made by grounding to the shield case, and the like.

It should be understood by those skilled in the art that various modifications, combinations, sub-combinations and alterations may occur depending on design requirements and other factors insofar as they are within the scope of the appended claims or the equivalents thereof.

Figure 9A:
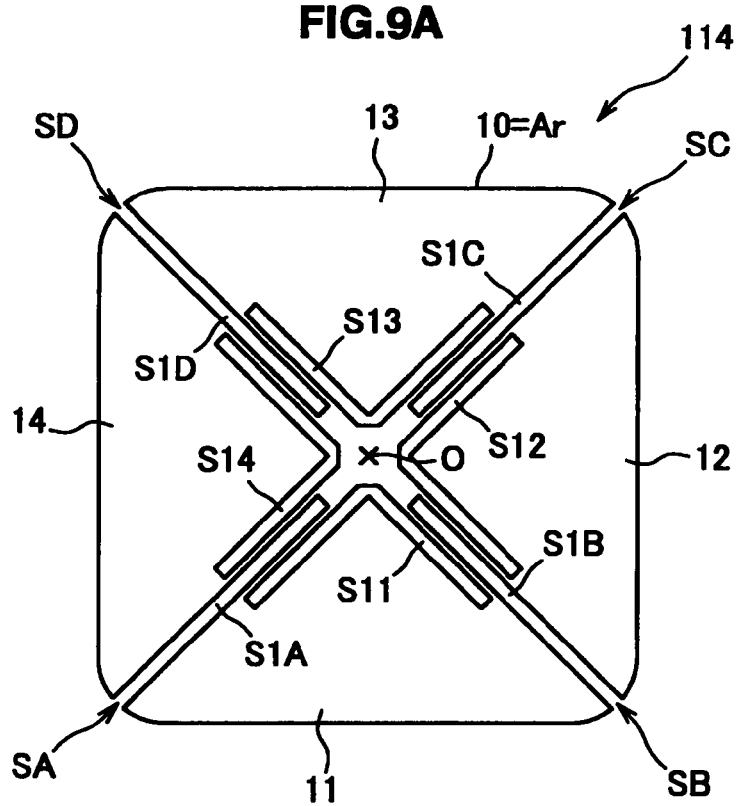
FIG. 9A is an explanatory view describing another variant of the radiation level reducing device according to the embodiment.

For instance, in the above-described embodiment, a case of drawing in the circular current I to the central part O side by the drawing slits S1A to S1D and directly canceling out the circular currents I etc. flowing through the adjacent slits SA to SD by the coupling slits S2A to S2D has been described. However, the effect of drawing and canceling out the circular current I can be indirectly realized through auxiliary coupling slits S11 to S14 in place of the coupling slits S2A to S2D, as shown in FIG. 9A. In this case, however, not only the circular current attenuating operation, but the radiation electric field component attenuating operation and the residual secondary radiation component attenuating operation are also suppressed low compared to the first embodiment, and thus the configuration of directly canceling out the circular currents I etc. as in the first embodiment is desirable.

Figure 9B:
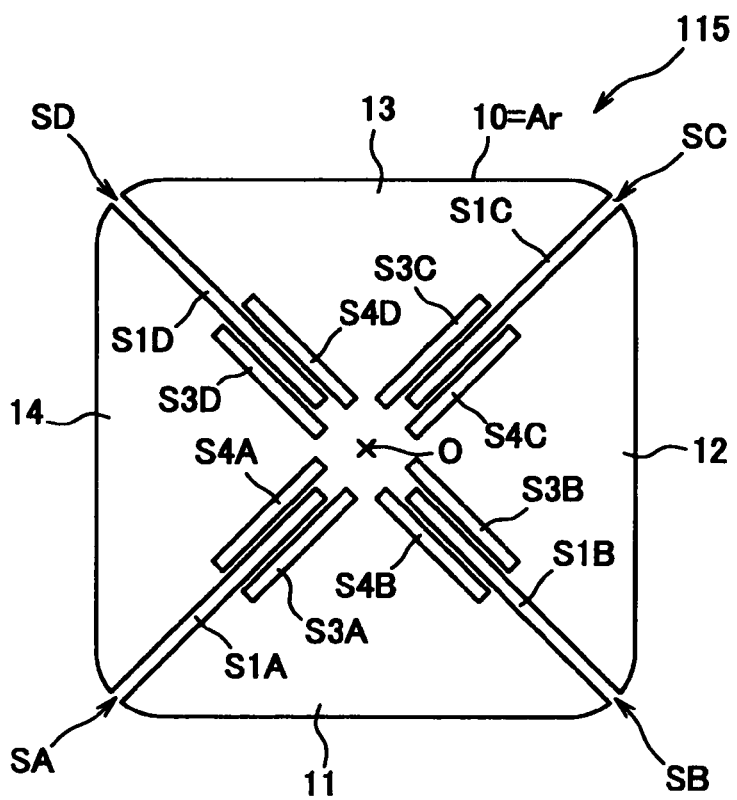
FIG. 9B is an explanatory view describing another variant of the radiation level reducing device according to the embodiment.

To realize the effect of reducing the circular current I and the like with each slit SA to SD alone, auxiliary slits S3A to S3D and auxiliary slits S4A to S4D may be arranged on both sides of the drawing slits S1A to S1D in place of the coupling slits S2A to S2D, as shown in FIG. 9B. In this case, the circular current I is guided towards the central part O side by the drawing slits S1A to S1D, and then flowed around the auxiliary slits, so that the circular current I can be reduced. In this case, however, the circular current attenuating operation and the radiation electric field component attenuating operation are difficult to sufficiently realize, and thus the configuration of canceling out the circular currents I etc. as in the first embodiment is desirable.

The present application contains subject matter related to that disclosed in Japanese Priority Patent Application JP 2009-22800 filed in the Japan Patent Office on 3 Feb. 2009, the entire content of which is hereby incorporated by reference.

What is claimed is:

1. A radiation level reducing device, comprising:
    a metal plate for entirely covering at least one surface of an electromagnetic wave generation source for radiating an electromagnetic wave;
    a cover region, set within a plane of the metal plate, for covering the entire one surface; and
    a plurality of slits formed to a band-shape in at least the cover region, and spaced apart from each other, wherein each of the plurality of slits includes,
        a drawing slit formed extending towards a central part of the cover region from an intense electric field position where an electric field generated in between the electromagnetic wave generation source by the electromagnetic wave is stronger than other positions at an outer periphery of the cover region so as to guide a circular current flowing in a peripheral direction surrounding the central part of the cover region in the central part direction of the cover region by the electromagnetic wave, and
        a coupling slit formed extending so as to line in parallel to another slit from an end in the central part direction of the cover region in the drawing slit so as to guide the circular current guided by the drawing slit to in between the other slit adjacent on one side in the peripheral direction of the cover region.

2. The radiation level reducing device according to claim 1, wherein $2^N$ slits are formed on the metal plate, N being a positive integer.

3. The radiation level reducing device according to claim 2, wherein the plurality of slits are arranged point symmetrically from each other with the central part of the cover region as a reference.

4. The radiation level reducing device according to claim 1, wherein
    the cover region is an entire region of the metal plate,
    the metal plate is formed with a center distance from the central part to the outer periphery unequal, and
    the intense electric field position is an edge position where the center distance is long compared to other sites.

5. The radiation level reducing device according to claim 4, wherein
    the metal plate is formed to a polygon having $2^M$ corners at an outer periphery, M being a positive integer of greater than or equal to two, and
    the intense electric field position is the corner.

6. The radiation level reducing device according to claim 5, wherein the metal plate is a regular polygon.

7. The radiation level reducing device according to claim 1, wherein the intense electric field position is a position at the outer periphery of the cover region corresponding to a corner in one surface of the electromagnetic wave generation source.

8. The radiation level reducing device according to claim 7, wherein
    the cover region is an entire region of the metal plate, and the metal plate is formed to a circular shape in which a center distance from the central part to the outer periphery equal.

* * * * *